US011924992B1

(12) United States Patent
Teeter et al.

(10) Patent No.: US 11,924,992 B1
(45) Date of Patent: Mar. 5, 2024

(54) RACK FRONT-TO-REAR CABLE ROUTING SYSTEM

(71) Applicant: Dell Products L.P., Round Rock, TX (US)

(72) Inventors: Victor Teeter, Round Rock, TX (US); Shree Rathinasamy, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/899,680

(22) Filed: Aug. 31, 2022

(51) Int. Cl.
*H05K 7/14* (2006.01)
*H05K 5/02* (2006.01)

(52) U.S. Cl.
CPC ......... *H05K 7/1491* (2013.01); *H05K 5/0247* (2013.01)

(58) Field of Classification Search
CPC ................. H05K 7/1491; H05K 5/0247
See application file for complete search history.

(56) References Cited

U.S. PATENT DOCUMENTS

| | | | | |
|---|---|---|---|---|
| 7,460,375 B2* | 12/2008 | Randall | ............... | H05K 7/1492 361/724 |
| 2010/0110628 A1* | 5/2010 | Barrenechea | ........ | H05K 7/1491 361/679.48 |
| 2012/0292267 A1* | 11/2012 | Goldenberg | ......... | H05K 7/1491 248/65 |
| 2023/0156377 A1* | 5/2023 | Schoenfelder | ........... | H04Q 1/06 385/135 |

* cited by examiner

*Primary Examiner* — Anthony Q Edwards
*Assistant Examiner* — Hung Q Dang
(74) *Attorney, Agent, or Firm* — Joseph Mencher

(57) ABSTRACT

A rack front-to-rear cable routing system includes a rack chassis having a first rack wall, a second rack wall opposite the first rack wall, a first rack entrance defined between the first and second rack walls, and a second rack entrance defined between the first and second rack walls and opposite the first rack entrance. A computing device housing is defined by the rack chassis. A rack front-to-rear cable routing device is located between the computing device housing and the first rack wall, and defines a protected cable conduit extending between the first and second rack entrances. The protected cable conduit houses a first cable connected to each of a first port on a first computing device in the computing device housing located adjacent the first rack entrance, and a second port on a second computing device in the computing device housing located adjacent the second rack entrance.

20 Claims, 20 Drawing Sheets

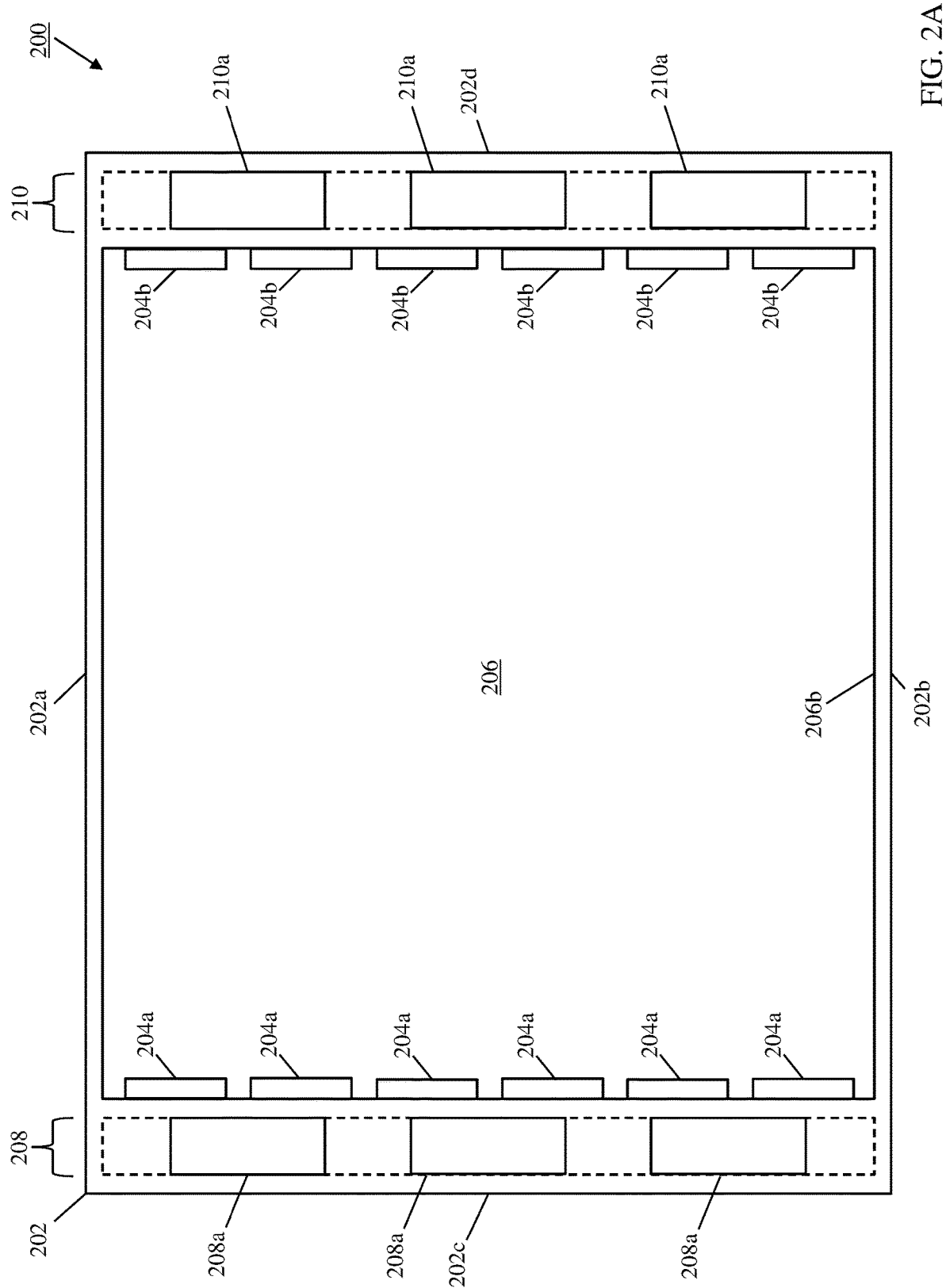

RACK FRONT-TO-REAR CABLE ROUTING SYSTEM

BACKGROUND

The present disclosure relates generally to information handling systems, and more particularly to the routing of cables between the front and rear of a rack that houses information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, switch devices, storage systems, and/or other computing devices known in the art, are often provided in racks and coupled together in order to enable those computing devices to transmit data between each other. For example, multiple server devices and storage systems may be provided in a rack with a switch device and each cabled to that switch device in order to enable the data transmissions discussed above. The cabling of such computing devices in a rack can raise issues. For example, conventional server devices and storage systems often include networking ports or other connectors on their rear surface that is located adjacent a rear portion of the rack when those server devices and storage systems are positioned in the rack, while conventional switch devices often include networking ports or other connectors on their front surface that is located adjacent a front portion of the rack when those switch devices are positioned in the rack, and thus the cabling of the networking ports on the server devices and storage systems to the networking ports on the switch device may require that cabling extend between the front portion of the rack to the rear portion of the rack.

For example, in a random sampling of thirty racks in a datacenter, the inventors of the present disclosure found that every rack sampled included multiple cables extending from the front portion of the rack to the rear portion of the rack. In some cases, the cables extended over a top wall of the rack, in other cases the cables extended around a side wall of the rack, and in yet other cases the cables extended through computing device housings defined by the rack that currently did not have any computing devices located therein. As will be appreciated by one of skill in the art, the extending of cables around a side wall of a rack will often be limited due to the positioning of racks immediately adjacent each other in a manner that provides no space available in-between them for cabling. Furthermore, the extending of cables through computing device housings defined by the rack can hinder airflow through that rack that could otherwise be used to cool computing devices, while using up those computing device housings that could otherwise house computing devices and often resulting in the premature purchase of additional racks in order to house additional computing devices. Finally, cabling computing devices by extending cables between the front portion and rear portion of a rack is time consuming, presents difficulties when attempting to trace the connection of computing devices via such "front-to-rear" cabling, and can result in "cabling bunches" that present difficulties when moving a cable in the cabling bunch or attempting to position a computing device in a rack adjacent the cabling bunch.

Accordingly, it would be desirable to provide a rack cable routing system that addresses the issues discussed above.

SUMMARY

According to one embodiment, an Information Handling System (IHS) includes a rack chassis including a first rack wall, a second rack wall located opposite the rack chassis from the first rack wall, a first rack entrance defined between the first rack wall and the second rack wall, and a second rack entrance defined between the first rack wall and the second rack wall and opposite the rack chassis from the first rack entrance; a plurality of computing devices that are housed in the rack chassis and that include a first computing device and a second computing device; and a first rack front-to-rear cable routing device that is located between at least one of the plurality of computing devices and the first rack wall, and that defines a first protected cable conduit that extends between the first rack entrance and the second rack entrance and that is configured to house a first cable that extends from a first surface of the first computing device that is adjacent the first rack entrance, and to a second surface of the second computing device that is adjacent the second rack entrance.

BRIEF DESCRIPTION OF THE DRAWINGS

FIG. 2A is a schematic front view illustrating an embodiment of a rack that may include the rack front-to-rear cable routing system of the present disclosure.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
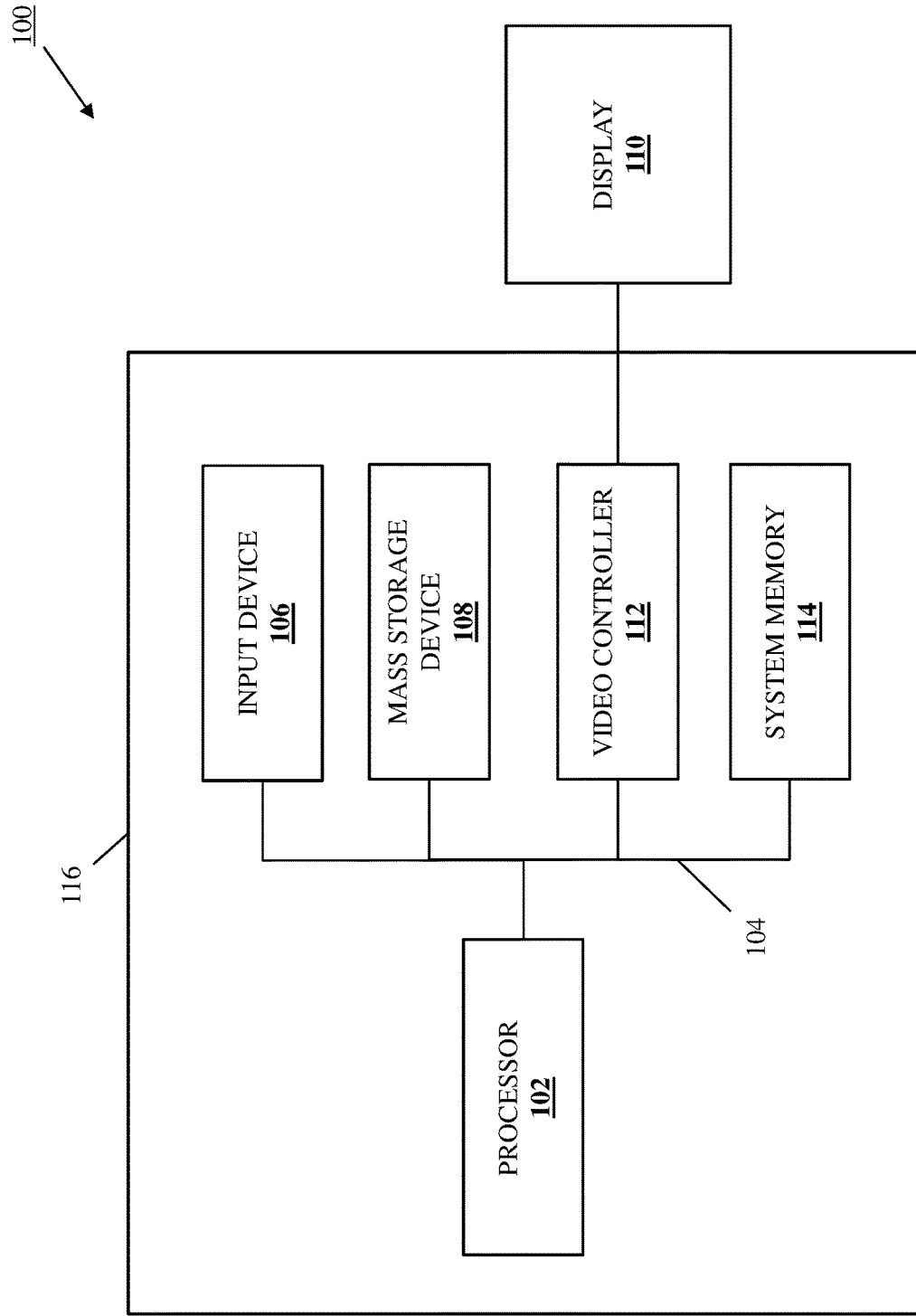
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2B:
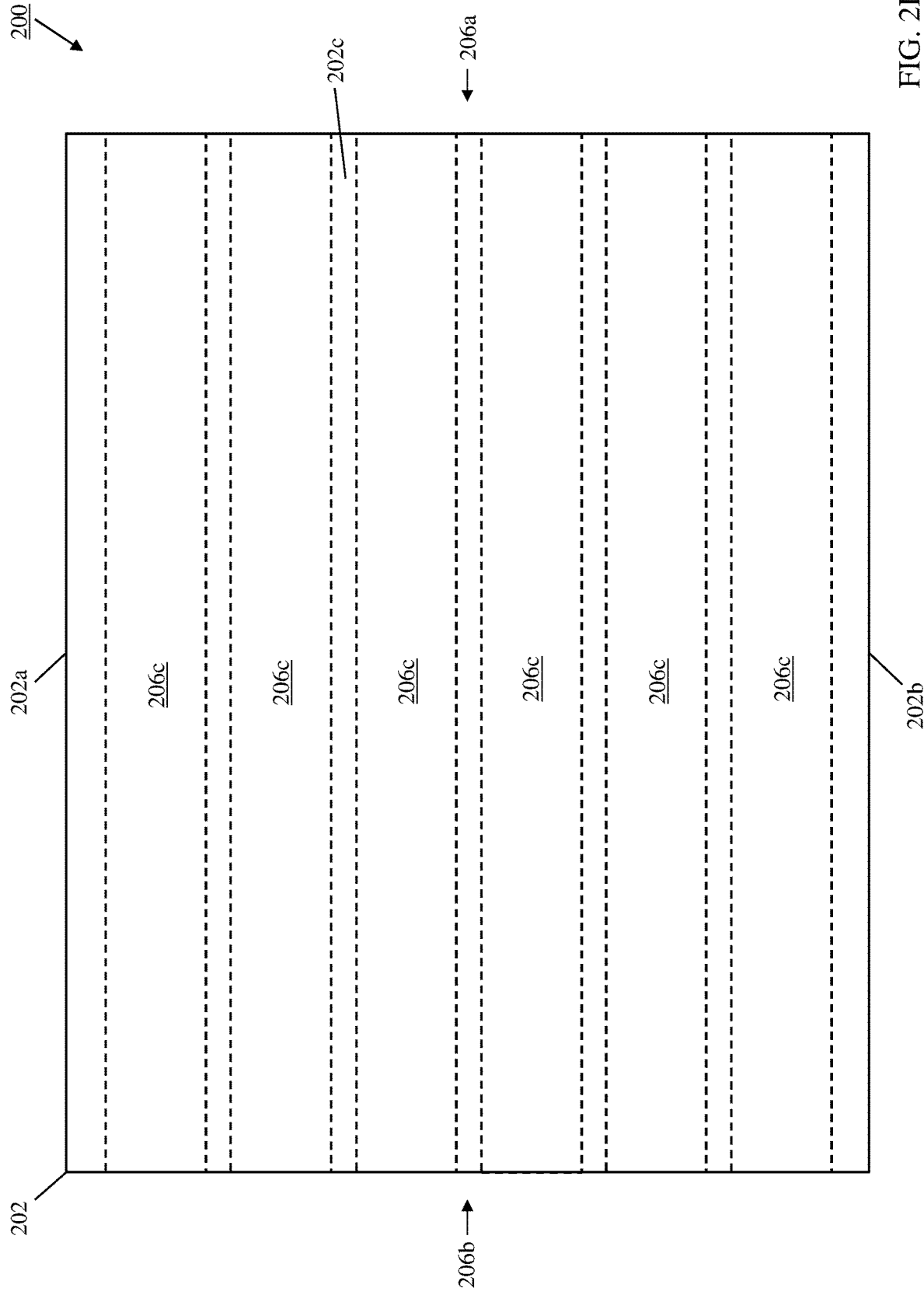
FIG. 2B is a schematic side view illustrating an embodiment of the rack of FIG. 2A.

Referring now to FIGS. 2A and 2B, an embodiment of a rack 200 is illustrated that may provide the rack front-to-rear cable routing system of the present disclosure. The rack 200 includes a rack chassis 202, and in the illustrated embodiment the rack chassis 202 includes a top wall 202a, a bottom wall 202b that is located opposite the rack chassis 202 from the top wall 202a, a pair of opposing side walls 202c and 202d that each extend between the top wall 202a and the bottom wall 202b and that are located opposite the rack chassis 202 from each other. A computing device mounting system is included on the rack chassis 202 and, in the illustrated embodiment, include a plurality of computing device mounting subsystems 204a that are located adjacent to and spaced apart from the side wall 202c of the rack chassis 202, and a plurality of computing device mounting subsystems 204b that are located adjacent to and spaced apart from the side wall 202d of the rack chassis 202.

As will be appreciated by one of skill in the art in possession of the present disclosure and as discussed below, respective pairs of the computing device mounting subsystems 204a and 204b on opposite sides of the rack chassis 202 are configured to couple to a respective computing device to allow that computing device to be positioned in the rack chassis 202, and thus any of the computing device mounting subsystems 204a and 204b may include computing device coupling/securing features for providing such functionality while remaining within the scope of the present disclosure. In a specific example, any or all of the computing device mounting subsystems 204a and 204b may be provided by READYRAIL® computing device mounting subsystems available from DELL® Inc. of Round Rock, Texas, United States, which one of skill in the art in possession of the present disclosure will recognize include a variety of toolless mounting interfaces for mounting both sliding READYRAIL® computing device mounting subsystems (e.g., which allow a computing device coupled thereto to move in and out of a rack) and static READYRAIL® computing device mounting subsystems (e.g., which hold a computing device coupled thereto stationary in a rack) to a rack. In the specific examples provided below, the READYRAIL® computing device mounting subsystems may be adapted to different mounting features (e.g., via a "two-post" mounting interface, a "four-post" toolless mounting interface, etc.) while remaining within the scope of the present disclosure as well.

The rack chassis 202 defines a computing device housing 204 between the top wall 202a, the bottom wall 202b, and the computing device mounting subsystems 204a and 204b. Furthermore, a rack entrance 206a is defined on a first/"front" side of the computing device housing 206 between the top wall 202a, the bottom wall 202b, and the computing device mounting subsystems 204a and 204b, while a rack entrance 206b (not visible in FIG. 2A) is defined on a second/"rear" side of the computing device housing 206 between the top wall 202a, the bottom wall 202b, and the computing device mounting subsystems 204a and 204b. Furthermore, FIG. 2B illustrates how the computing device housing 206 includes a plurality of respective computing device housing volumes 206c that are defined between each pair of the computing device mounting subsystems 204a and 204b and each configured to house a respective computing device as discussed above.

In the illustrated embodiment, the rack chassis 202 also defines a cable routing device housing 208 between the top wall 202a, the bottom wall 202b, the computing device mounting subsystem 204a, and the side wall 202c, with a plurality of cable routing device housing access areas 208a defined by the rack chassis 202 in a spaced apart orientation from each other between the top wall 202a and the bottom wall 202b of the rack chassis 202. The rack chassis 202 also defines a cable routing device housing 210 between the top wall 202a, the bottom wall 202b, the computing device mounting subsystem 204b, and the side wall 202d, with a plurality of cable routing device housing access areas 210a defined by the rack chassis 202 in a spaced apart orientation from each other between the top wall 202a and the bottom wall 202b of the rack chassis 202. In a specific example, the rack 200 illustrated in FIGS. 2A and 2B may be provided by NETSHELTER® SX series rack available from the AMERICAN POWER CONVERSION (APC)® corporation of Oakland, California, United States, which one of skill in the art in possession of the present disclosure will recognize may include a rack chassis that provides increased depth and width relative to conventional racks (e.g., a 1200 mm depth×750 mm width vs. a conventional 1070 mm depth× 600 mm width) that provides for the cable routing device housings discussed above. However, one of skill in the art in possession of the present disclosure will appreciate how other racks including other dimensions will fall within the scope of the present disclosure as well.

As will be appreciated by one of skill in the art in possession of the present disclosure, while many of the embodiments discussed below describe the rack 200 as having cable routing device(s) coupled thereto (i.e., a user may purchase a rack and then couple cable routing device(s) provided according to the teachings of the present disclosure to that rack), in other embodiments cable routing device(s) provided according to the teachings of the present disclosure may be integrated into a rack to provide the benefits described below while remaining within the scope of the present disclosure as well. As such, while a specific rack 200 has been illustrated and described, one of skill in the art in possession of the present disclosure will recognize that racks provided according to the teachings of the present disclosure may include a variety of components and component configurations while remaining within the scope of the present disclosure as well.

Figure 3A:
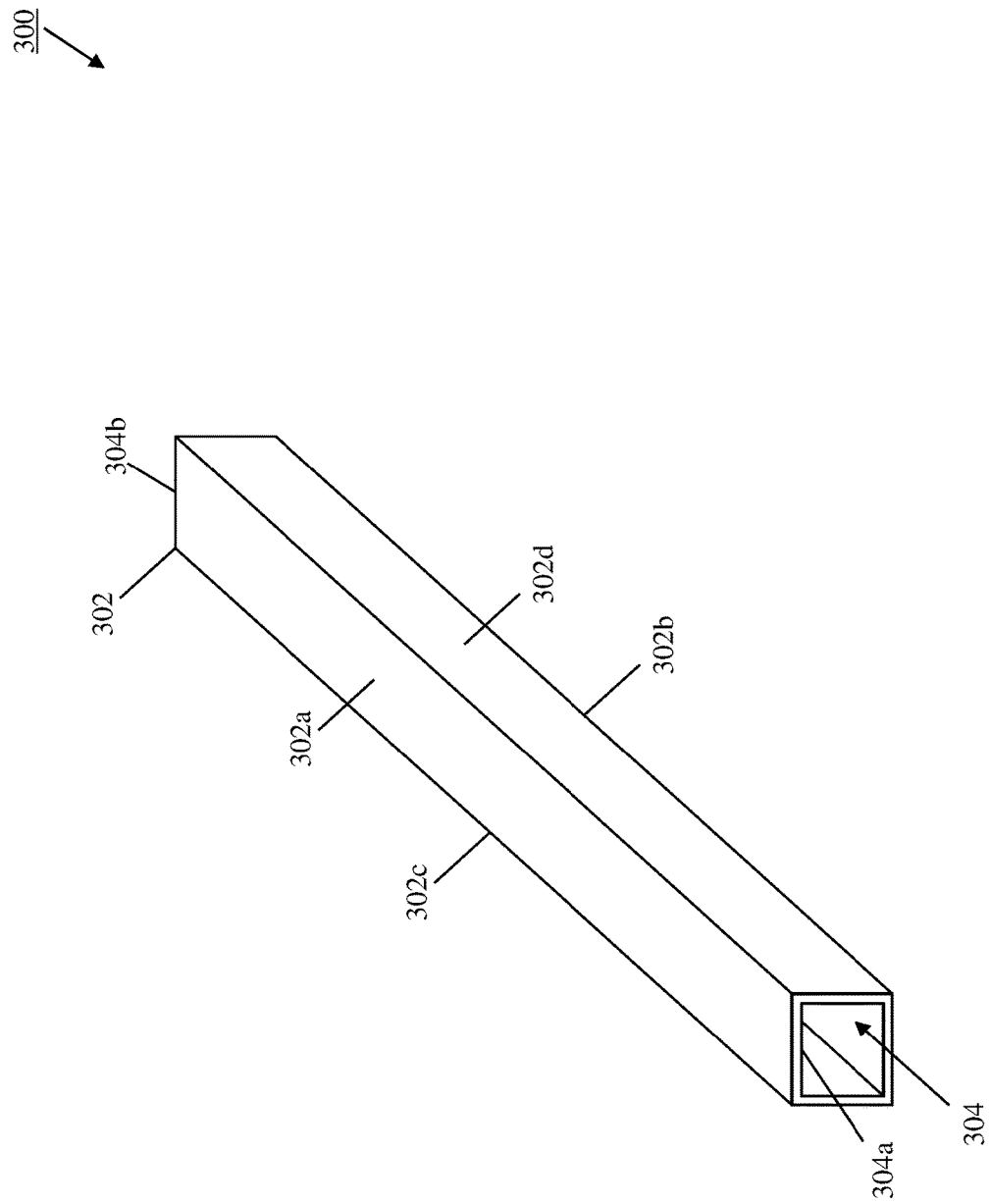
FIG. 3A is a perspective view illustrating an embodiment of a rack front-to-rear cable routing device that may be used to provide the rack front-to-rear cable routing system of the present disclosure.

Referring now to FIG. 3A, an embodiment of a cable routing device 300 is illustrated that may provide the rack front-to-rear cable routing system of the present disclosure. The cable routing device 300 includes a chassis 302 that, in the illustrated embodiment, includes a square cross section, but that as discussed below may include different shapes while remaining within the scope of the present disclosure as well. As discussed below, the chassis 302 may include a length that is substantially equal to the depth of the rack in which it will be used (e.g., the 1200 mm depth of the rack 200 in the example provided above), although one of skill in the art in possession of the present disclosure will appreciate how other lengths for the chassis of the cable routing devices of the present disclosure will fall within the scope of the present disclosure as well. In different embodiments, the chassis 302 of the cable routing device 300 may be fabricated from metal materials, plastic materials, and/or any other materials that would be apparent to one of skill in the art in possession of the present disclosure, with particular benefits being realized in many situations with relatively lighter weight materials.

In the illustrated embodiment, the chassis 302 includes a top wall 302a, a bottom wall 302b that is located opposite the chassis 302 from the top wall 302a, and a pair of side walls 302c and 302d that each extend between the top wall 302a and the bottom wall 302b and that are located opposite the chassis 302 from each other. The chassis 302 defines a protected cable conduit 304 along its length between the top wall 302a, the bottom wall 302b, and the side walls 302c and 302d, with a protected cable conduit entrance 304a defined by the chassis 302 on a first end of the cable routing device 300 immediately adjacent the protected cable conduit 304, and a protected cable conduit exit 304b defined by the chassis 302 on a second end of the cable routing device 300 that is opposite the first end of the cable routing device 300 and immediately adjacent the protected cable conduit 304. While the protected cable conduit exit 304b is identified but not visible in FIG. 3A, one of skill in the art in possession of the present disclosure will appreciate how the protected cable conduit exit 304b may be substantially similar to the protected cable conduit entrance 304a that is visible in FIG. 3A.

In an embodiment, the "protection" provided by the protected cable conduit 304 may result from the protected cable conduit 304 being defined on all sides by the top wall 302a, the bottom wall 302b, and the side walls 302c and 302d of the chassis 302 of the cable routing device 300 such that any portion of a cable positioned in the protected cable conduit 304 is surrounded by the chassis 302. However, in other embodiments, the top wall 302a, the bottom wall 302b, and the side walls 302c and 302d of the chassis 302 may define holes, gaps, perforations, and/or chassis portions such that the protected cable conduit 304 is not completely "surrounded" by the chassis 302 while still providing protection for any portion of a cable positioned therein. As such, while a specific cable routing device 300 has been illustrated and described, one of skill in the art in possession of the present disclosure will appreciate how the cable routing devices of the present disclosure may include a variety of components and/or component configurations while remaining within the scope of the present disclosure as well.

In some embodiments, the cable routing device 300 illustrated in FIG. 3A may be positioned in a rack (e.g., the rack 200 discussed above with reference to FIG. 2 in the examples below) without the need for rack mounting features like those described in some of the examples provided below. For example, the cable routing device 300 may be configured to be positioned on elements of the rack chassis 202 (e.g., a ledge, shelf, crossbar, and/or other rack element in the rack chassis 202) and utilized as described below without the need for the rack mounting features discussed below that are configured to mount the cable routing device 300 to the rack chassis 202. However, other embodiments of the present disclosure may provide rack mounting features on the cable routing device 300 that are configured to mount the cable routing device 300 to the rack chassis 202.

Figure 3B:
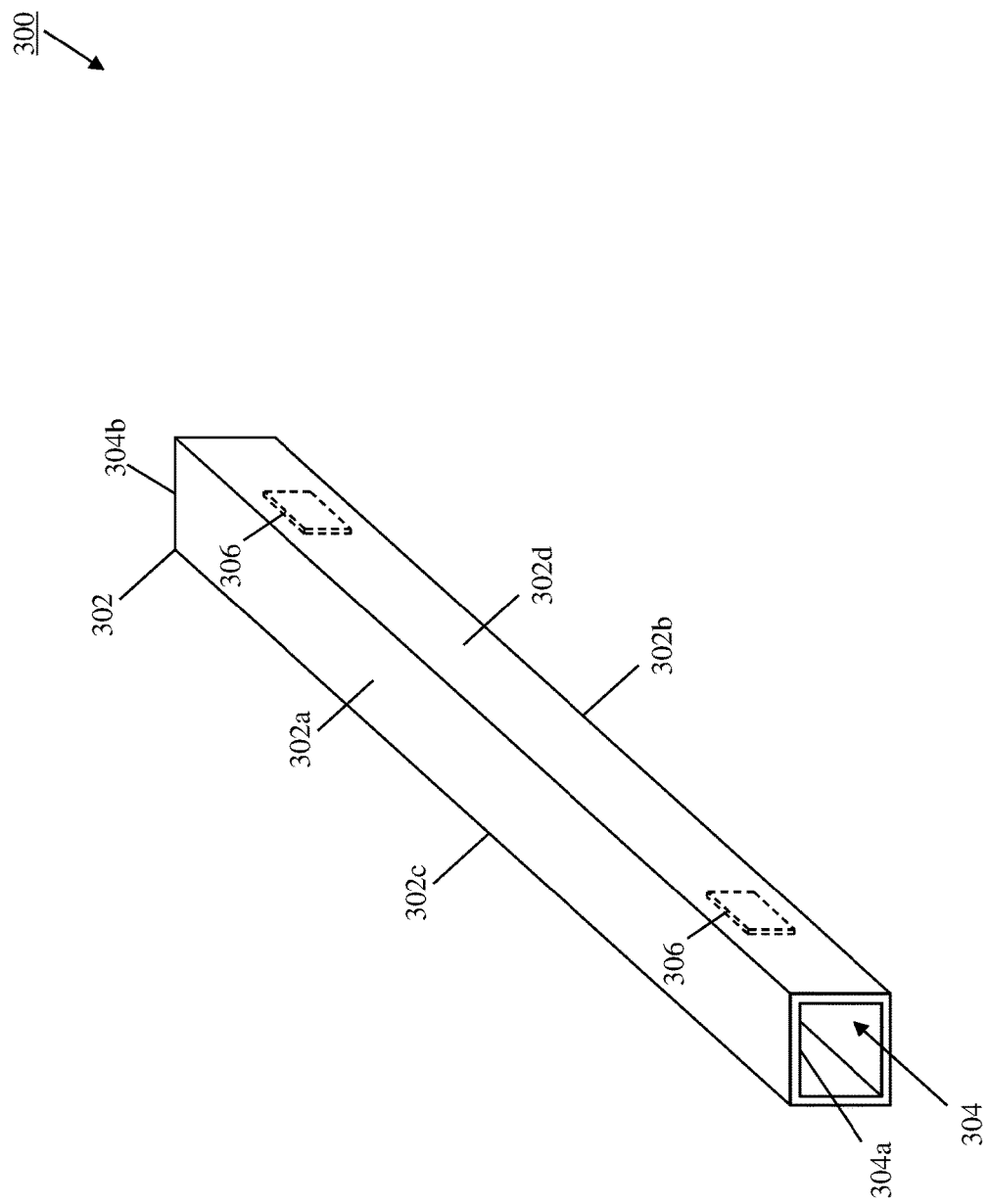
FIG. 3B is a perspective view illustrating an embodiment of the rack front-to-rear cable routing device of FIG. 3A.

For example, with reference to FIG. 3B, the chassis 302 of the cable routing device 300 may include a plurality of rack mounting features that, in the embodiment illustrated in FIG. 3B, may be provided by a pair of magnetic rack mounting features 306 that may be located in the side wall 302d of the chassis 302 (e.g., as indicated by the dashed lines used to illustrate the magnetic rack mounting features 306) in a spaced apart orientation and adjacent opposite ends of the cable routing device 300. As will be appreciated by one of skill in the art in possession of the present disclosure, each of the magnetic rack mounting features 306 may be fabricated from a magnetic material that is configured to be magnetically attracted to a portion of (e.g., a metallic element included on) a rack. However, while the magnetic rack mounting features 306 are illustrated and described as only being provided on one of the side walls of the chassis 302, one of skill in the art in possession of the present disclosure will appreciate how similar magnetic rack mounting features may be provided on any or all of the top wall 302a, the bottom wall 302b, and/or the side wall 302c of the chassis 302 while remaining within the scope of the present disclosure as well. Furthermore, while illustrated and described as being provided by magnetic rack mounting features in FIG. 3B, one of skill in the art in possession of the present disclosure will appreciate how the magnetic rack mounting features 306 may be replaced by adhesive rack mounting features on a surface of the side wall 302d of the chassis 302 (or other portions of the chassis 302) that are configured to adhere to a portion of a rack while remaining within the scope of the present disclosure as well.

Figure 3C:
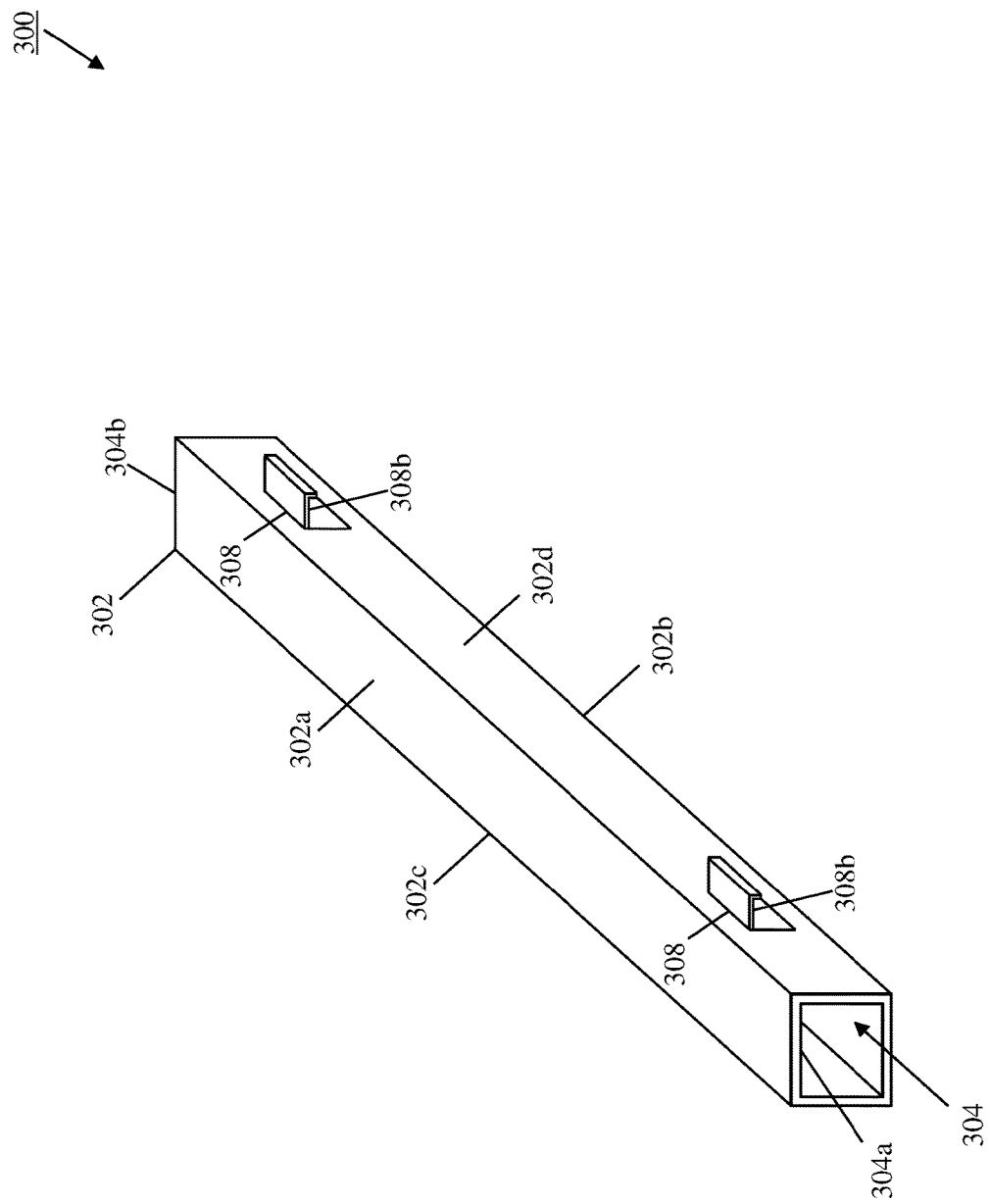
FIG. 3C is a perspective view illustrating an embodiment of the rack front-to-rear cable routing device of FIG. 3A.

In another example, with reference to FIG. 3C, the chassis 302 of the cable routing device 300 may include a plurality of rack mounting features that, in the embodiment illustrated in FIG. 3C, may be provided by a pair of hook rack mounting features 308 that may be included on the side wall 302d of the chassis 302 in a spaced apart orientation and adjacent opposite ends of the cable routing device 300. As can be seen in FIG. 3C, each of the hook rack mounting features 308 extend from the side wall 302d of the chassis 302 and define a rack engagement channel 308a that is configured to engage a portion of a rack to couple the cable routing device 300 to the rack. However, while the hook rack mounting features 308 are illustrated and described as only being provided on one of the side walls of the chassis 302, one of skill in the art in possession of the present disclosure will appreciate how similar hook rack mounting features may be provided on any or all of the top wall 302a, the bottom wall 302b, and/or the side wall 302c of the chassis 302 while remaining within the scope of the present disclosure as well.

Figure 3D:
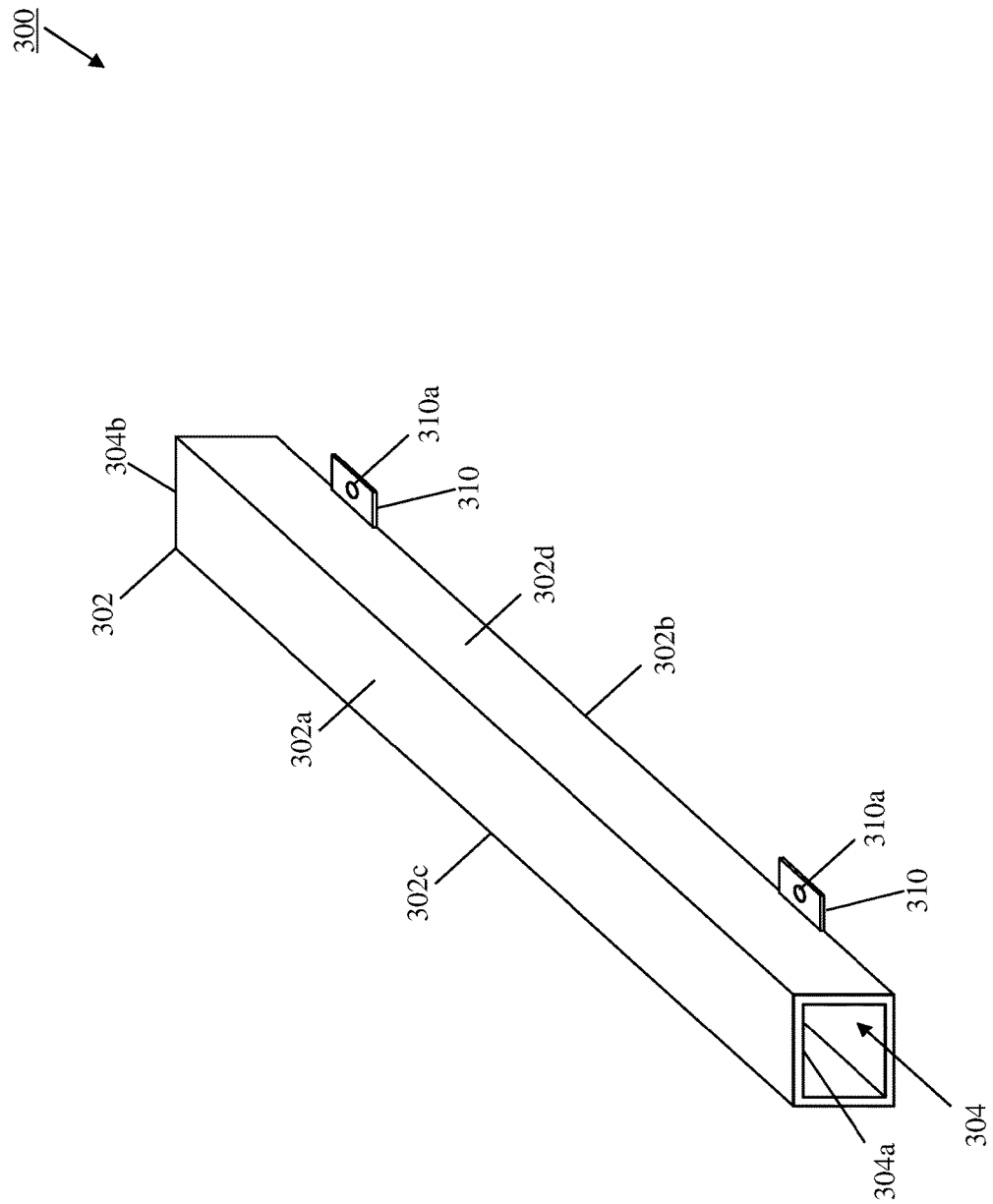
FIG. 3D is a perspective view illustrating an embodiment of the rack front-to-rear cable routing device of FIG. 3A.

In another example, with reference to FIG. 3D, the chassis 302 of the cable routing device 300 may include a plurality of rack mounting features that, in the embodiment illustrated in FIG. 3D, may be provided by a pair of rack-based bracket rack mounting features 310 that may be included on the side wall 302d of the chassis 302 in a spaced apart orientation and adjacent opposite ends of the cable routing device 300. As can be seen in FIG. 3D, each of the rack-based bracket rack mounting features 310 extend from the side wall 302d of the chassis 302 adjacent the bottom wall 302b and define a mounting aperture 310a that is configured to receive a fastener that also engages a similar aperture on a rack to couple the cable routing device 300 to the rack. However, while the rack-based bracket rack mounting features 310 are illustrated and described as only being provided on one of the side walls of the chassis 302, one of skill in the art in possession of the present disclosure will appreciate how similar rack-based bracket rack mounting features may be provided on any or all of the top wall 302a, the bottom wall 302b, and/or the side wall 302c of the chassis 302 while remaining within the scope of the present disclosure as well.

Figure 3E:
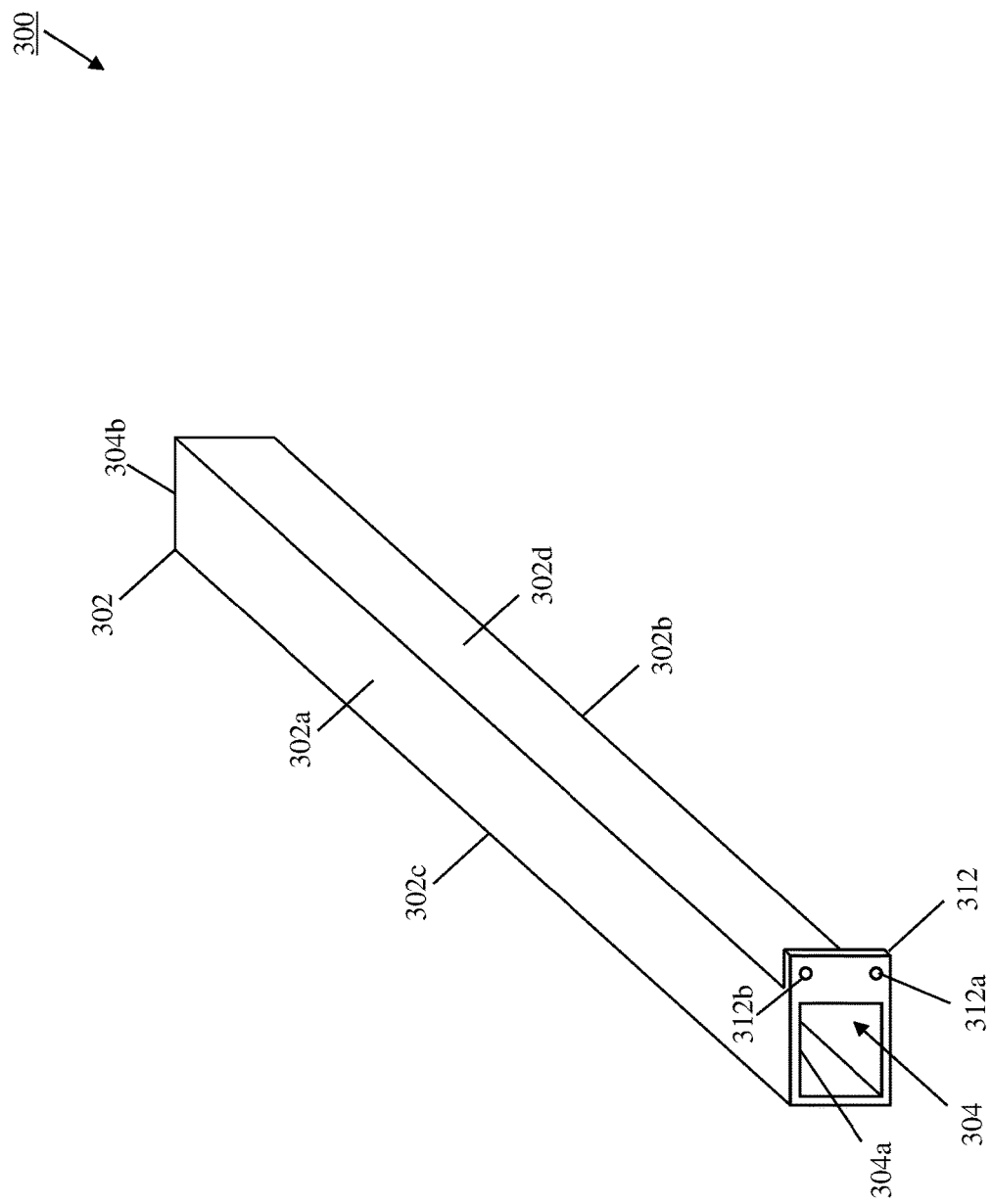
FIG. 3E is a perspective view illustrating an embodiment of the rack front-to-rear cable routing device of FIG. 3A.

In another example, with reference to FIG. 3E, the chassis 302 of the cable routing device 300 may include a rack mounting feature that, in the embodiment illustrated in FIG. 3E, may be provided by a computing-device-mounting-subsystem-based bracket rack mounting feature 312 that may be included on the side wall 302d of the chassis 302 immediately adjacent the protected cable conduit entrance 304a. As can be seen in FIG. 3E, the computing-device-mounting-subsystem-based bracket rack mounting feature 312 extends from the side wall 302d of the chassis 302 immediately adjacent the protected cable conduit entrance 304a and defines mounting apertures 312a that are configured to engage computing device mounting subsystems (e.g., any of the computing device mounting subsystems 204a or 204b) to couple the cable routing device 300 to the rack. Continuing with the specific example provided above, the mounting apertures 312a on the computing-device-mounting-subsystem-based bracket rack mounting feature 312 may engage the "two-post" toolless mounting interface on one of the READYRAIL® computing device mounting subsystems discussed above during its toolless coupling to the rack 200 to couple the cable routing device 300 to the rack 200. However, while only one computing-device-mounting-subsystem-based bracket rack mounting feature 312 is illustrated and described as being included on the chassis 302, one of skill in the art in possession of the present disclosure will appreciate how similar computing-device-mounting-subsystem-based bracket rack mounting feature may be provided on the chassis 302 immediately adjacent the protected cable conduit exit 304b (and may couple to the rack 200 via the READYRAIL® computing device mounting subsystem similarly as described above) while remaining within the scope of the present disclosure as well.

However, while several specific examples of rack mounting features have been described, one of skill in the art in possession of the present disclosure will appreciate how the cable routing device 300 may be mounted to a rack using other techniques while remaining within the scope of the present disclosure. Furthermore, one of skill in the art in possession of the present disclosure will appreciate how combinations of any of the rack mounting features illustrated and described above with reference to FIGS. 3B-3E may be provided on the same cable routing device 300 and used to mount the cable routing device 300 to a rack while remaining within the scope of the present disclosure as well.

Figure 4:
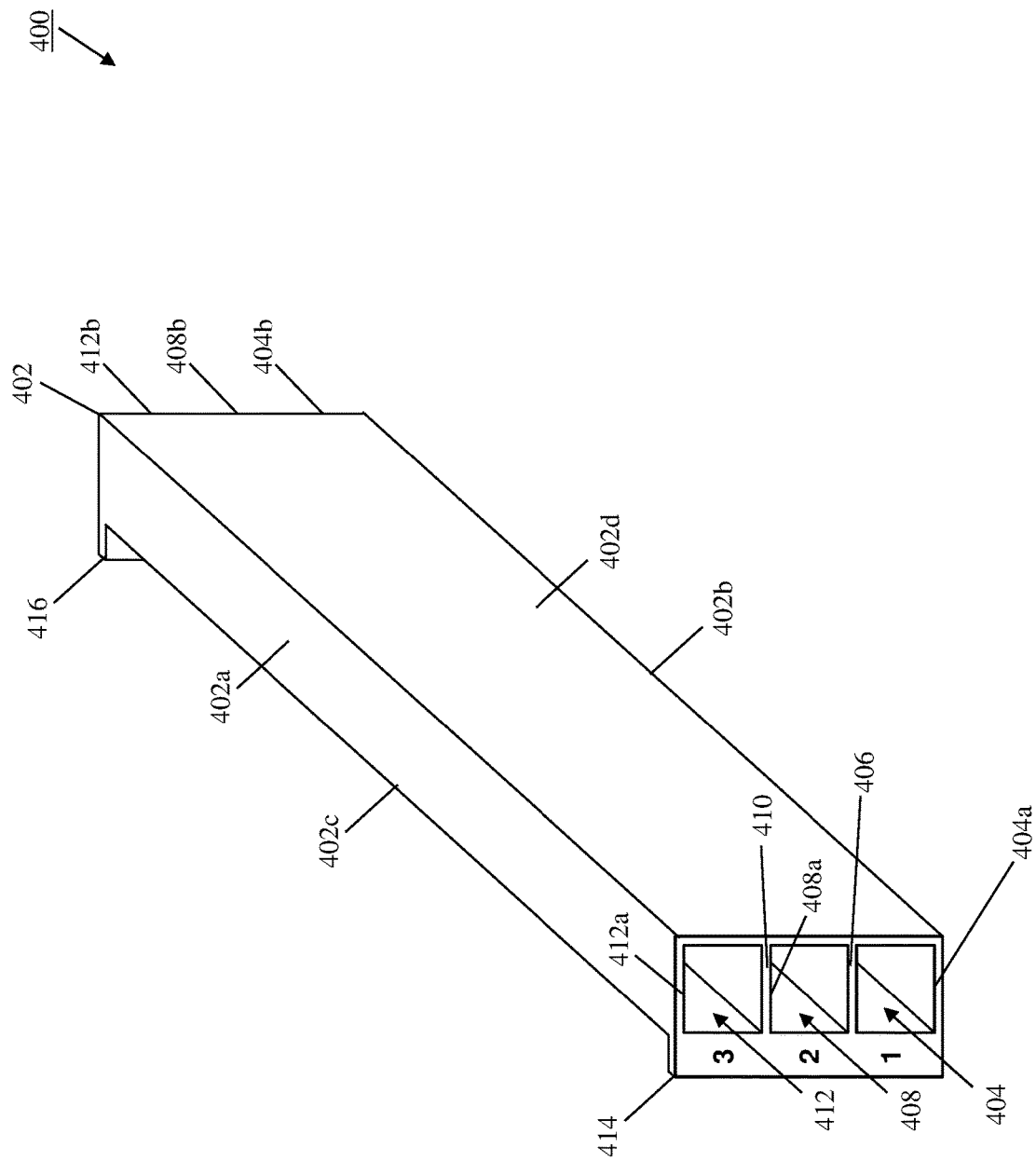
FIG. 4 is a perspective view illustrating an embodiment of a rack front-to-rear cable routing device that may be used to provide the rack front-to-rear cable routing system of the present disclosure.

Referring now to FIG. 4, an embodiment of a cable routing device 400 is illustrated that may provide the rack front-to-rear cable routing system of the present disclosure. The cable routing device 400 includes a chassis 402 that, in the illustrated embodiment, includes a rectangular cross section, but that may include different shapes while remaining within the scope of the present disclosure as well. As discussed below, the chassis 402 may include a length that is substantially equal to the depth of the rack in which it will be used (e.g., the 1200 mm depth of the rack 200 in the example provided above), although one of skill in the art in possession of the present disclosure will appreciate how other lengths for the chassis of the cable routing devices of the present disclosure will fall within the scope of the present disclosure as well. In different embodiments, the chassis 402 of the cable routing device 400 may be fabricated from metal materials, plastic materials, and/or any other materials that would be apparent to one of skill in the art in possession of the present disclosure, with particular benefits being realized in many situations with relatively lighter weight materials.

In the illustrated embodiment, the chassis 402 includes a top wall 402a, a bottom wall 402b that is located opposite the chassis 402 from the top wall 402a, and a pair of side walls 402c and 402d that each extend between the top wall 402a and the bottom wall 402b and that are located opposite the chassis 402 from each other. In the illustrated embodiment, the chassis 402 defines a plurality of protected cable conduits in a 3×1 orientation. For example, a first protected cable conduit 404 is defined along with the length of the chassis 402 between the bottom wall 402b, the side walls 402c and 402d, and an intermediate wall 406 that extends between the side walls 402c and 402, with a protected cable conduit entrance 404a defined by the chassis 402 on a first end of the cable routing device 400 immediately adjacent the first protected cable conduit 404, and a protected cable conduit exit 404b defined by the chassis 402 on a second end of the cable routing device 400 that is opposite the first end of the cable routing device 400 and immediately adjacent the first protected cable conduit 404. While the protected cable conduit exit 404b is identified but not visible in FIG. 4A, one of skill in the art in possession of the present disclosure will appreciate how the protected cable conduit exit 404b may be substantially similar to the protected cable conduit entrance 404a that is visible in FIG. 4A.

The chassis 402 also defines a second protected cable conduit 408 along its length between the intermediate wall 406, the side walls 402c and 402d, and an intermediate wall 410 that extends between the side walls 402c and 402, with a protected cable conduit entrance 408a defined by the chassis 402 on a first end of the cable routing device 400 immediately adjacent the second protected cable conduit 408, and a protected cable conduit exit 408b defined by the chassis 402 on a second end of the cable routing device 400 that is opposite the first end of the cable routing device 400 and immediately adjacent the second protected cable conduit 408. While the protected cable conduit exit 408b is identified but not visible in FIG. 4, one of skill in the art in possession of the present disclosure will appreciate how the protected cable conduit exit 408b may be substantially similar to the protected cable conduit entrance 408a that is visible in FIG. 4.

The chassis 402 also defines a third protected cable conduit 412 along its length between the intermediate wall 410, the top wall 402a, and the side walls 402c and 402d, with a protected cable conduit entrance 412a defined by the chassis 402 on a first end of the cable routing device 400 immediately adjacent the third protected cable conduit 412, and a protected cable conduit exit 412b defined by the chassis 402 on a second end of the cable routing device 400 that is opposite the first end of the cable routing device 400 and immediately adjacent the third protected cable conduit 412. While the protected cable conduit exit 412b is identified but not visible in FIG. 4, one of skill in the art in possession of the present disclosure will appreciate how the protected cable conduit exit 412b may be substantially similar to the protected cable conduit entrance 412a that is visible in FIG. 4.

In an embodiment, the "protection" provided by the first protected cable conduit 404, the second protected cable conduit 408, and the third protected cable conduit 412 may result from the first protected cable conduit 404 being defined on all sides by the intermediate wall 406, the bottom wall 402b, and the side walls 402c and 402d of the chassis 402 of the cable routing device 400 such that any portion of a cable positioned in the first protected cable conduit 404 is surrounded by the chassis 402; the second protected cable conduit 408 being defined on all sides by the intermediate wall 410, the intermediate wall 406, and the side walls 402c and 402d of the chassis 402 of the cable routing device 400 such that any portion of a cable positioned in the second protected cable conduit 408 is surrounded by the chassis 402; and the third protected cable conduit 412 being defined on all sides by the intermediate wall 410, the top wall 402a, and the side walls 402c and 402d of the chassis 402 of the cable routing device 400 such that any portion of a cable positioned in the third protected cable conduit 412 is surrounded by the chassis 402.

However, in other embodiments, the top wall 402a, the bottom wall 402b, the side walls 402c and 402d, and/or the intermediate walls 406 and 410 of the chassis 402 may define holes, gaps, perforations, and/or chassis portions such that any of the first protected cable conduit 404, the second protected cable conduit 408, and/or the third protected cable conduit 412 are not completely "surrounded" by the chassis 402 while still providing protection for any portion of a cable positioned therein. In the illustrated embodiment, a protected cable conduit identification element 414 extends from the side wall 402c of the chassis 402 adjacent each of the protected cable conduit entrances 404a, 408a, and 412a of the first cable conduit 404, the second cable conduit 408, and the third cable conduit 412, respectively. As can be seen in FIG. 4, the protected cable conduit identification element 414 includes a first cable conduit identifier (e.g., "1") located adjacent the protected cable conduit entrance 404a of the first cable conduit 404, a second cable conduit identifier (e.g., "2") located adjacent the protected cable conduit entrance 408a of the second cable conduit 408, and a third cable conduit identifier (e.g., "3") located adjacent the protected cable conduit entrance 412a of the third cable conduit 412.

Furthermore, a protected cable conduit identification element 416 extends from the side wall 402c of the chassis 402 adjacent each of the protected cable conduit exits 404b, 408b, and 412b of the first cable conduit 404, the second cable conduit 408, and the third cable conduit 412, respectively. While not visible in FIG. 4, one of skill in the art in possession of the present disclosure will appreciate how the protected cable conduit identification element 416 may be similar to the protected cable conduit identification element 414, and thus may include a first cable conduit identifier (e.g., "1") located adjacent the protected cable conduit exit 404b of the first cable conduit 404, a second cable conduit identifier (e.g., "2") located adjacent the protected cable conduit exit 408b of the second cable conduit 408, and a third cable conduit identifier (e.g., "3") located adjacent the protected cable conduit exit 412b of the third cable conduit 412.

While not illustrated or described in detail herein, similar to the cable routing device 300, the cable routing device 400 may be positioned in a rack (e.g., the rack 200 discussed above with reference to FIG. 2 in the examples below) without the need for rack mounting features, or may include rack mounting features similar to any of those described in detail above for the cable routing device 300 in FIGS. 3B-3E. However, while a specific cable routing device 400 has been illustrated and described, one of skill in the art in possession of the present disclosure will appreciate how the cable routing devices of the present disclosure may include a variety of components and/or component configurations while remaining within the scope of the present disclosure as well.

Figure 5:
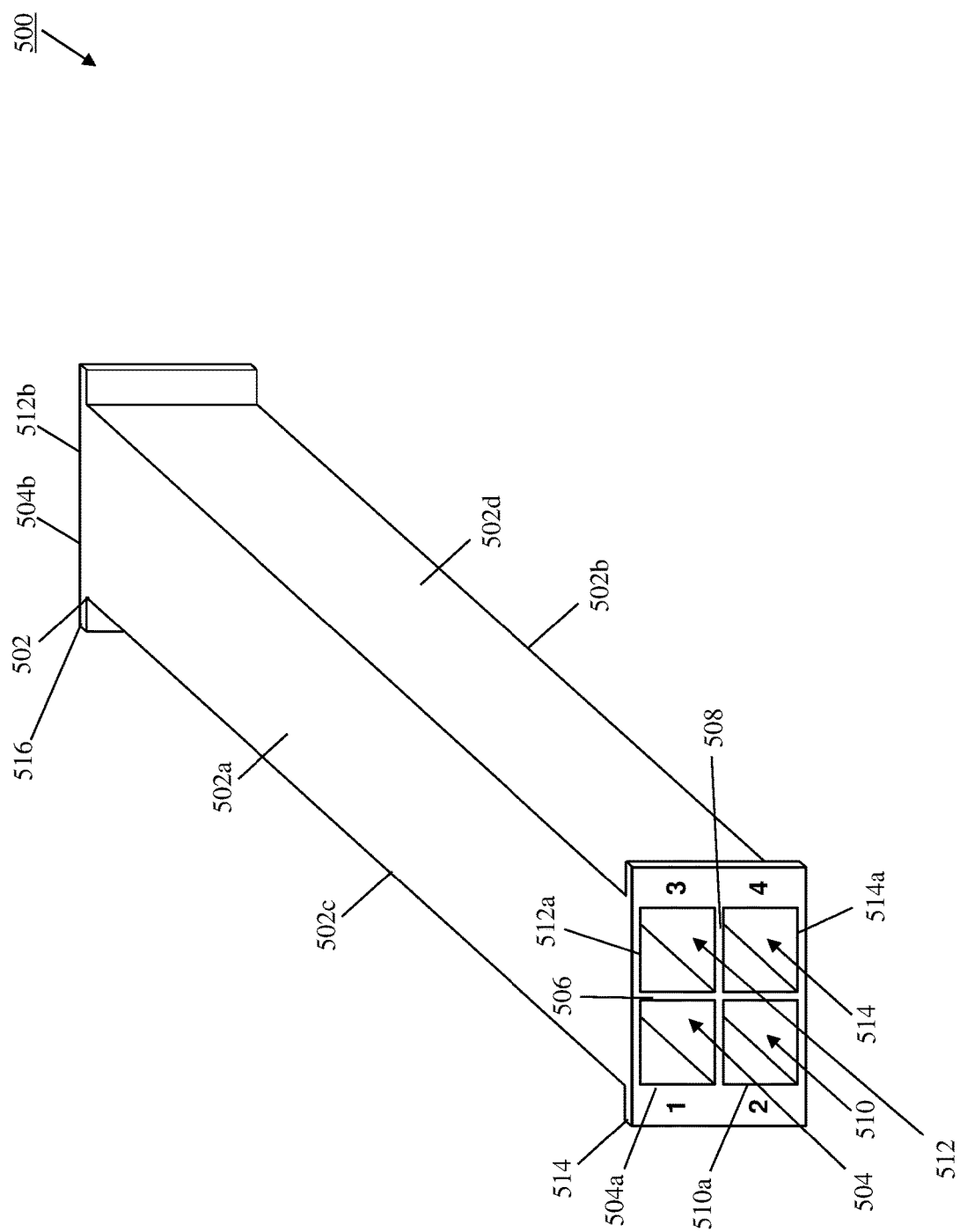
FIG. 5 is a perspective view illustrating an embodiment of a rack front-to-rear cable routing device that may be used to provide the rack front-to-rear cable routing system of the present disclosure.

Referring now to FIG. 5, an embodiment of a cable routing device 500 is illustrated that may provide the rack front-to-rear cable routing system of the present disclosure. The cable routing device 500 includes a chassis 502 that, in the illustrated embodiment, includes a square cross section, but that as discussed below may include different shapes while remaining within the scope of the present disclosure as well. As discussed below, the chassis 502 may include a length that is substantially equal to the depth of the rack in which it will be used (e.g., the 1200 mm depth of the rack 200 in the example provided above), although one of skill in the art in possession of the present disclosure will appreciate how other lengths for the chassis of the cable routing devices of the present disclosure will fall within the scope of the present disclosure as well. In different embodiments, the chassis 502 of the cable routing device 500 may be fabricated from metal materials, plastic materials, and/or any other materials that would be apparent to one of skill in the art in possession of the present disclosure, with particular benefits being realized in many situations with relatively lighter weight materials.

In the illustrated embodiment, the chassis 502 includes a top wall 502a, a bottom wall 502b that is located opposite the chassis 502 from the top wall 502a, and a pair of side walls 502c and 502d that each extend between the top wall 502a and the bottom wall 502b and that are located opposite the chassis 502 from each other. In the illustrated embodiment, the chassis 502 defines a plurality of protected cable conduits in a 2×2 orientation. For example, a first protected cable conduit 504 is defined along with the length of the chassis 502 between the side wall 502c, the top wall 502a, a first intermediate wall 506 that extends between the top walls 502a and the bottom wall 502b, and a second intermediate wall 508 that extends between the side walls 502c and 502d, and with a protected cable conduit entrance 504a defined by the chassis 502 on a first end of the cable routing device 500 immediately adjacent the first protected cable conduit 504, and a protected cable conduit exit 504b defined by the chassis 502 on a second end of the cable routing device 500 that is opposite the first end of the cable routing device 500 and immediately adjacent the first protected cable conduit 504. While the protected cable conduit exit 504b is identified but not visible in FIG. 5, one of skill in the art in possession of the present disclosure will appreciate how the protected cable conduit exit 504b may be substantially similar to the protected cable conduit entrance 504a that is visible in FIG. 5.

The chassis 502 also defines a second protected cable conduit 510 along its length between the intermediate wall 506, the intermediate wall 508, the bottom wall 502b, and the side wall 502c, with a protected cable conduit entrance 510a defined by the chassis 502 on a first end of the cable routing device 500 immediately adjacent the second protected cable conduit 510, and a protected cable conduit exit (not visible) defined by the chassis 502 on a second end of the cable routing device 500 that is opposite the first end of the cable routing device 500 and immediately adjacent the second protected cable conduit 508. While the protected cable conduit exit for the second protected cable conduit 510 is not visible in FIG. 5, one of skill in the art in possession of the present disclosure will appreciate how the protected cable conduit exit for the second protected cable conduit 510 may be substantially similar to the protected cable conduit entrance 510a that is visible in FIG. 5.

The chassis 502 also defines a third protected cable conduit 512 along its length between the intermediate wall 506, the intermediate wall 508, the top wall 502a, and the side wall 502d, with a protected cable conduit entrance 512a defined by the chassis 402 on a first end of the cable routing device 500 immediately adjacent the third protected cable conduit 512, and a protected cable conduit exit 512b defined by the chassis 502 on a second end of the cable routing device 500 that is opposite the first end of the cable routing device 500 and immediately adjacent the third protected cable conduit 512. While the protected cable conduit exit 512b is identified but not visible in FIG. 5, one of skill in the art in possession of the present disclosure will appreciate how the protected cable conduit exit 512b may be substantially similar to the protected cable conduit entrance 512a that is visible in FIG. 5.

The chassis 502 also defines a fourth protected cable conduit 514 along its length between the intermediate wall 506, the intermediate wall 508, the bottom wall 502b, and the side wall 502d, with a protected cable conduit entrance 514a defined by the chassis 502 on a first end of the cable routing device 500 immediately adjacent the fourth protected cable conduit 514, and a protected cable conduit exit (not visible) defined by the chassis 502 on a second end of the cable routing device 500 that is opposite the first end of the cable routing device 500 and immediately adjacent the fourth protected cable conduit 514. While the protected cable conduit exit for the fourth protected cable conduit 514 is not visible in FIG. 5, one of skill in the art in possession of the present disclosure will appreciate how the protected cable conduit exit for the fourth protected cable conduit 514 may be substantially similar to the protected cable conduit entrance 514a that is visible in FIG. 5.

In an embodiment, the "protection" provided by the first protected cable conduit 404, the second protected cable conduit 510, and the third protected cable conduit 512, and the fourth protected cable conduit 514 may result from the first protected cable conduit 504 being defined on all sides by the intermediate walls 506 and 508, the top wall 502a, and the side wall 502c of the chassis 502 of the cable routing device 500 such that any portion of a cable positioned in the first protected cable conduit 504 is surrounded by the chassis 502; the second protected cable conduit 510 being defined on all sides by the intermediate walls 506 and 508, the bottom wall 502b, and the side wall 502c of the chassis 502 of the cable routing device 500 such that any portion of a cable positioned in the second protected cable conduit 510 is surrounded by the chassis 502; the third protected cable conduit 512 being defined on all sides by the intermediate walls 506 and 508, the top wall 502a, and the side wall 502d of the chassis 502 of the cable routing device 500 such that any portion of a cable positioned in the third protected cable conduit 512 is surrounded by the chassis 502; and the fourth protected cable conduit 514 being defined on all sides by the intermediate walls 506 and 508, the bottom wall 502b, and the side wall 502d of the chassis 502 of the cable routing device 500 such that any portion of a cable positioned in the fourth protected cable conduit 514 is surrounded by the chassis 502.

However, in other embodiments, the top wall 502a, the bottom wall 502b, the side walls 502c and 502d, and/or the intermediate walls 506 and 508 of the chassis 502 may define holes, gaps, perforations, and/or chassis portions such that any of the first protected cable conduit 504, the second protected cable conduit 510, the third protected cable conduit 512, and/or the fourth protected cable conduit 514 are not completely "surrounded" by the chassis 502 while still providing protection for any portion of a cable positioned therein. In the illustrated embodiment, a protected cable conduit identification element 514 extends from each of the side walls 502c and 502d of the chassis 502 adjacent each of the protected cable conduit entrances 504a, 510a, 512a, and 514a of the first cable conduit 504, the second cable conduit 510, the third cable conduit 512, and the fourth cable conduit 514. As can be seen in FIG. 5, the protected cable conduit identification element 514 includes a first cable conduit identifier (e.g., "1") located adjacent the protected cable conduit entrance 504a of the first cable conduit 504, a second cable conduit identifier (e.g., "2") located adjacent the protected cable conduit entrance 510a of the second cable conduit 510, a third cable conduit identifier (e.g., "3") located adjacent the protected cable conduit entrance 512a of the third cable conduit 512, and a fourth cable conduit identifier (e.g., "4") located adjacent the protected cable conduit entrance 514a of the fourth cable conduit 514.

Furthermore, a protected cable conduit identification element 516 extends from the side walls 502c and 502d of the chassis 502 adjacent each of the protected cable conduit exits (e.g., 504b and 512b) of the first cable conduit 504, the second cable conduit 510, the third cable conduit 512, and the fourth cable conduit 514. While not visible in FIG. 5, one of skill in the art in possession of the present disclosure will appreciate how the protected cable conduit identification element 516 may be similar to the protected cable conduit identification element 514, and thus may include a first cable conduit identifier (e.g., "1") located adjacent the protected cable conduit exit 504b of the first cable conduit 504, a second cable conduit identifier (e.g., "2") located adjacent the protected cable conduit exit of the second cable conduit 510, a third cable conduit identifier (e.g., "3") located adjacent the protected cable conduit exit 512b of the third cable conduit 412, and a fourth cable conduit identifier (e.g., "4") located adjacent the protected cable conduit exit of the fourth cable conduit 514.

While not illustrated or described in detail herein, similar to the cable routing device 300, the cable routing device 500 may be positioned in a rack (e.g., the rack 200 discussed above with reference to FIG. 2 in the examples below) without the need for rack mounting features, or may include rack mounting features similar to any of those described in detail above for the cable routing device 300 in FIGS. 3B-3E. However, while a specific cable routing device 500 has been illustrated and described, one of skill in the art in possession of the present disclosure will appreciate how the cable routing devices of the present disclosure may include a variety of components and/or component configurations while remaining within the scope of the present disclosure as well.

Figure 6:
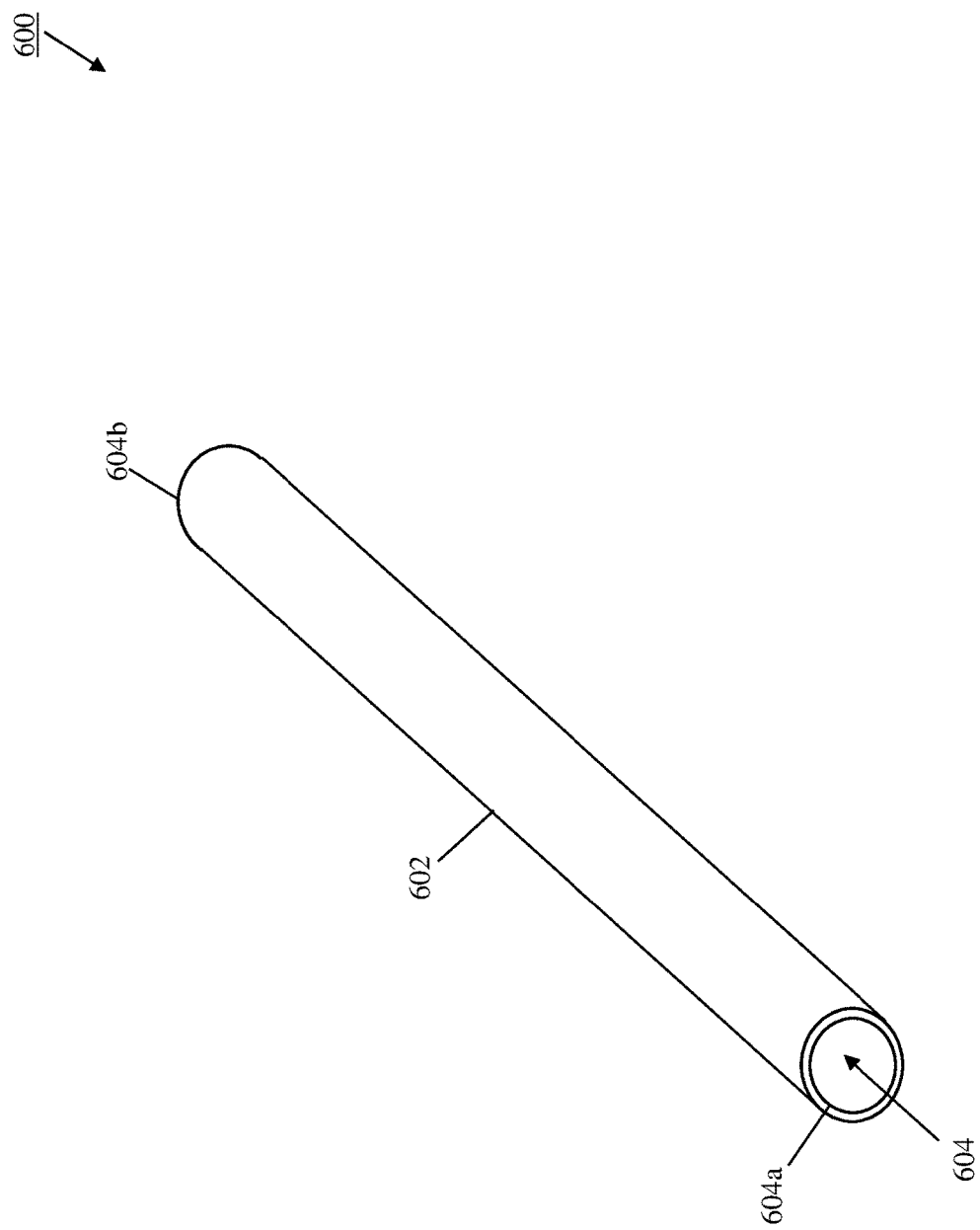
FIG. 6 is a perspective view illustrating an embodiment of a rack front-to-rear cable routing device that may be used to provide the rack front-to-rear cable routing system of the present disclosure.

Referring now to FIG. 6, an embodiment of a cable routing device 600 is illustrated that may provide the rack front-to-rear cable routing system of the present disclosure. The cable routing device 600 includes a chassis 602 that, in the illustrated embodiment, is tubular with a first diameter, but that as discussed below may include different shapes while remaining within the scope of the present disclosure as well. As discussed below, the chassis 602 may include a length that is substantially equal to the depth of the rack in which it will be used (e.g., the 1200 mm depth of the rack 200 in the example provided above), although one of skill in the art in possession of the present disclosure will appreciate how other lengths for the chassis of the cable routing devices of the present disclosure will fall within the scope of the present disclosure as well. In different embodiments, the chassis 602 of the cable routing device 600 may be fabricated from metal materials, plastic materials, and/or any other materials that would be apparent to one of skill in the art in possession of the present disclosure, with particular benefits being realized in many situations with relatively lighter weight materials.

In the illustrated embodiment, the chassis 602 defines a protected cable conduit 604 along its length, with a protected cable conduit entrance 604a defined by the chassis 602 on a first end of the cable routing device 600 immediately adjacent the protected cable conduit 604, and a protected cable conduit exit 604b defined by the chassis 602 on a second end of the cable routing device 600 that is opposite the first end of the cable routing device 600 and immediately adjacent the protected cable conduit 604. While the protected cable conduit exit 604b is identified but not visible in FIG. 6, one of skill in the art in possession of the present disclosure will appreciate how the protected cable conduit exit 604b may be substantially similar to the protected cable conduit entrance 604a that is visible in FIG. 6. In an embodiment, the "protection" provided by the protected cable conduit 604 may result from the protected cable conduit 604 being defined on all sides by the chassis 602 of the cable routing device 600 such that any portion of a cable positioned in the protected cable conduit 604 is surrounded by the chassis 602. However, in other embodiments, the chassis 602 may define holes, gaps, perforations, and/or chassis portions such that the protected cable conduit 604 is not completely "surrounded" by the chassis 602 while still providing protection for any portion of a cable positioned therein.

While not illustrated or described in detail herein, similar to the cable routing device 300, the cable routing device 600 may be positioned in a rack (e.g., the rack 200 discussed above with reference to FIG. 2 in the examples below) without the need for rack mounting features, or may include rack mounting features similar to any of those described in detail above for the cable routing device 300 in FIGS. 3B-3E. As such, while a specific cable routing device 600 has been illustrated and described, one of skill in the art in possession of the present disclosure will appreciate how the cable routing devices of the present disclosure may include a variety of components and/or component configurations while remaining within the scope of the present disclosure as well.

Figure 7:
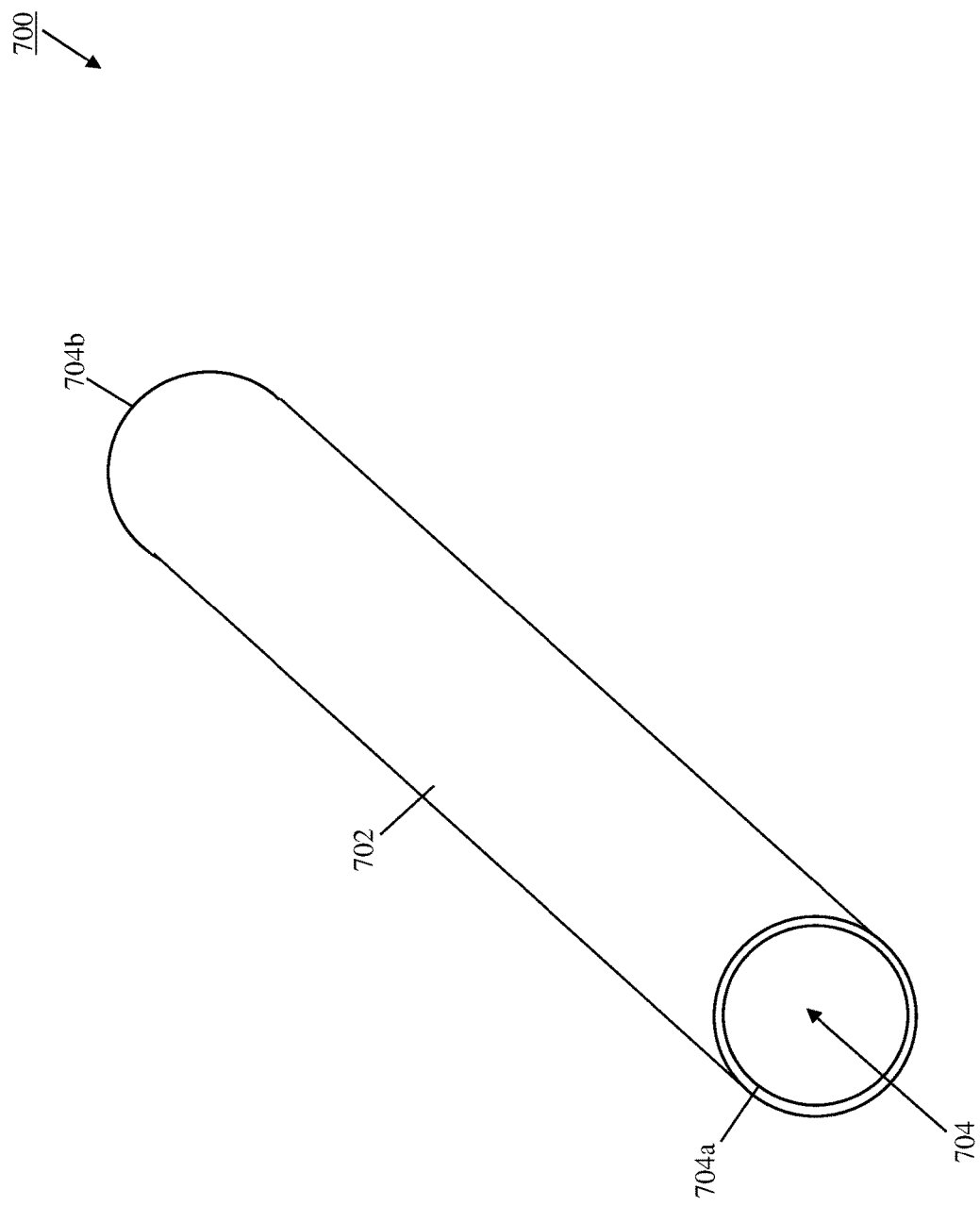
FIG. 7 is a perspective view illustrating an embodiment of a rack front-to-rear cable routing device that may be used to provide the rack front-to-rear cable routing system of the present disclosure.

Referring now to FIG. 7, an embodiment of a cable routing device 700 is illustrated that may provide the rack front-to-rear cable routing system of the present disclosure. The cable routing device 700 includes a chassis 702 that, in the illustrated embodiment, is tubular with a second diameter that is larger than the first diameter of the tubular chassis 602 on the cable routing device 600 discussed above with reference to FIG. 6, but that as discussed below may include different shapes while remaining within the scope of the present disclosure as well. As discussed below, the chassis 702 may include a length that is substantially equal to the depth of the rack in which it will be used (e.g., the 1200 mm depth of the rack 200 in the example provided above), although one of skill in the art in possession of the present disclosure will appreciate how other lengths for the chassis of the cable routing devices of the present disclosure will fall within the scope of the present disclosure as well. In different embodiments, the chassis 702 of the cable routing device 700 may be fabricated from metal materials, plastic materials, and/or any other materials that would be apparent to one of skill in the art in possession of the present disclosure, with particular benefits being realized in many situations with relatively lighter weight materials.

In the illustrated embodiment, the chassis 702 defines a protected cable conduit 704 along its length, with a protected cable conduit entrance 704a defined by the chassis 702 on a first end of the cable routing device 700 immediately adjacent the protected cable conduit 704, and a protected cable conduit exit 704b defined by the chassis 702 on a second end of the cable routing device 700 that is opposite the first end of the cable routing device 700 and immediately adjacent the protected cable conduit 704. While the protected cable conduit exit 704b is identified but not visible in FIG. 7, one of skill in the art in possession of the present disclosure will appreciate how the protected cable conduit exit 704b may be substantially similar to the protected cable conduit entrance 704a that is visible in FIG. 7. In an embodiment, the "protection" provided by the protected cable conduit 704 may result from the protected cable conduit 704 being defined on all sides by the chassis 702 of the cable routing device 700 such that any portion of a cable positioned in the protected cable conduit 704 is surrounded by the chassis 702. However, in other embodiments, the chassis 702 may define holes, gaps, perforations, and/or chassis portions such that the protected cable conduit 704 is not completely "surrounded" by the chassis 702 while still providing protection for any portion of a cable positioned therein.

While not illustrated or described in detail herein, similar to the cable routing device 300, the cable routing device 700 may be positioned in a rack (e.g., the rack 200 discussed above with reference to FIG. 2 in the examples below) without the need for rack mounting features, or may include rack mounting features similar to any of those described in detail above for the cable routing device 300 in FIGS. 3B-3E. As such, while a specific cable routing device 700 has been illustrated and described, one of skill in the art in possession of the present disclosure will appreciate how the cable routing devices of the present disclosure may include a variety of components and/or component configurations while remaining within the scope of the present disclosure as well.

Figure 8:
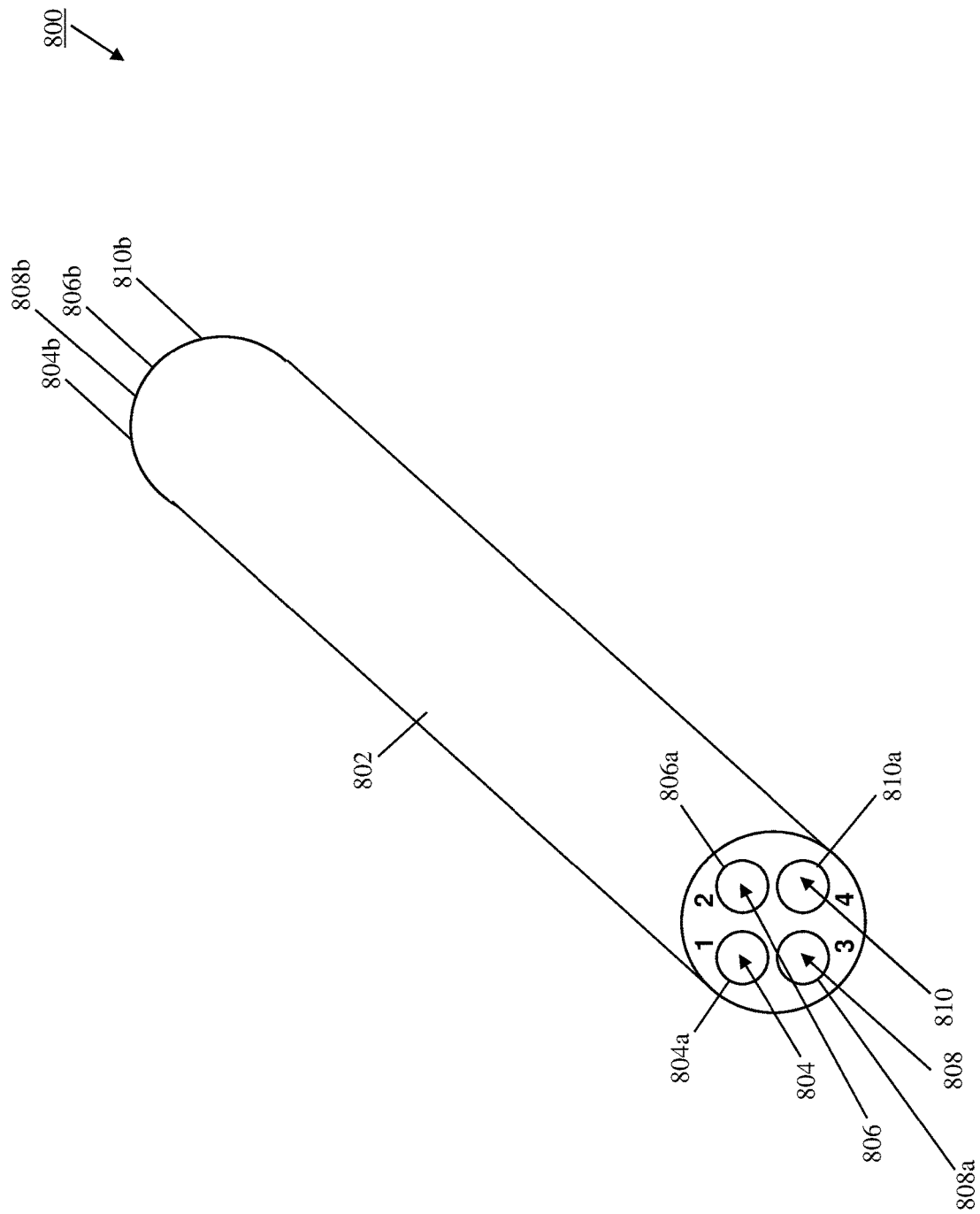
FIG. 8 is a perspective view illustrating an embodiment of a rack front-to-rear cable routing device that may be used to provide the rack front-to-rear cable routing system of the present disclosure.

Referring now to FIG. 8, an embodiment of a cable routing device 800 is illustrated that may provide the rack front-to-rear cable routing system of the present disclosure. The cable routing device 800 includes a chassis 802 that, in the illustrated embodiment, is cylindrical, but that as discussed below may include different shapes while remaining within the scope of the present disclosure as well. As discussed below, the chassis 802 may include a length that is substantially equal to the depth of the rack in which it will be used (e.g., the 1200 mm depth of the rack 200 in the example provided above), although one of skill in the art in possession of the present disclosure will appreciate how other lengths for the chassis of the cable routing devices of the present disclosure will fall within the scope of the present disclosure as well. In different embodiments, the chassis 802 of the cable routing device 800 may be fabricated from metal materials, plastic materials, and/or any other materials that would be apparent to one of skill in the art in possession of the present disclosure, with particular benefits being realized in many situations with relatively lighter weight materials.

In the illustrated embodiment, the chassis 802 defines a first protected cable conduit 804 along its length, with a protected cable conduit entrance 804a defined by the chassis 802 on a first end of the cable routing device 800 immediately adjacent the first protected cable conduit 804, and a protected cable conduit exit 804b defined by the chassis 802 on a second end of the cable routing device 800 that is opposite the first end of the cable routing device 800 and immediately adjacent the first protected cable conduit 804. The chassis 802 also defines a second protected cable conduit 806 along its length, with a protected cable conduit entrance 806a defined by the chassis 802 on a first end of the cable routing device 800 immediately adjacent the second protected cable conduit 806, and a protected cable conduit exit 806b defined by the chassis 802 on a second end of the cable routing device 800 that is opposite the first end of the cable routing device 800 and immediately adjacent the second protected cable conduit 806.

The chassis 802 also defines a third protected cable conduit 808 along its length, with a protected cable conduit entrance 808a defined by the chassis 802 on a first end of the cable routing device 800 immediately adjacent the third protected cable conduit 808, and a protected cable conduit exit 808b defined by the chassis 802 on a second end of the cable routing device 800 that is opposite the first end of the cable routing device 800 and immediately adjacent the third protected cable conduit 808. The chassis 802 also defines a fourth protected cable conduit 810 along its length, with a protected cable conduit entrance 810a defined by the chassis 802 on a first end of the cable routing device 800 immediately adjacent the fourth protected cable conduit 810, and a protected cable conduit exit 810b defined by the chassis 802 on a second end of the cable routing device 800 that is opposite the first end of the cable routing device 800 and immediately adjacent the fourth protected cable conduit 810.

While the protected cable conduit exits 804b, 806b, 808b, and 810b are identified but not visible in FIG. 8, one of skill in the art in possession of the present disclosure will appreciate how the protected cable conduit exits 804b, 806b, 808b, and 810b may be substantially similar to the protected cable conduit entrances 804a, 806a, 808a, and 810a that are visible in FIG. 8. In an embodiment, the "protection" provided by the protected cable conduits 804, 806, 808, and 810 may result from the protected cable conduits 804, 806, 808, and 810 being defined on all sides by the chassis 802 of the cable routing device 800 such that any portion of a cable positioned in the protected cable conduits 804, 806, 808, and 810 is surrounded by the chassis 802. However, in other embodiments, the chassis 802 may define holes, gaps, perforations, and/or chassis portions such that the protected cable conduits 804, 806, 808, and 810 are not completely "surrounded" by the chassis 802 while still providing protection for any portion of a cable positioned therein.

While not illustrated or described in detail herein, similar to the cable routing device 300, the cable routing device 800 may be positioned in a rack (e.g., the rack 200 discussed above with reference to FIG. 2 in the examples below) without the need for rack mounting features, or may include rack mounting features similar to any of those described in detail above for the cable routing device 300 in FIGS. 3B-3E. As such, while a specific cable routing device 800 has been illustrated and described, one of skill in the art in possession of the present disclosure will appreciate how the cable routing devices of the present disclosure may include a variety of components and/or component configurations while remaining within the scope of the present disclosure as well.

Figure 9:
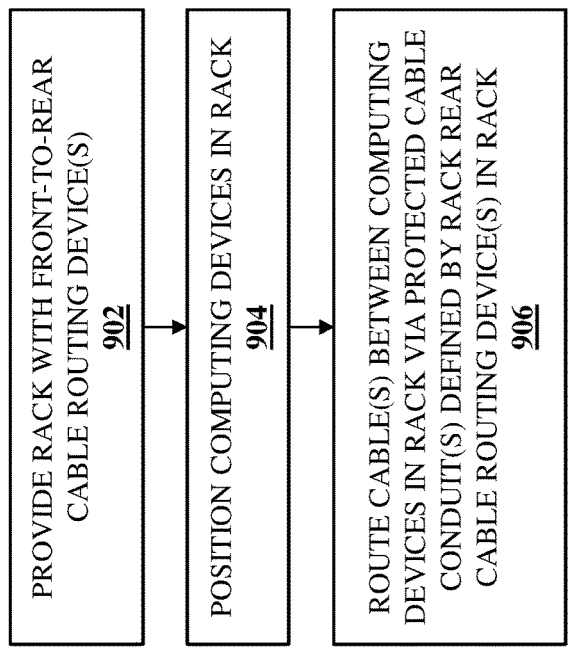
FIG. 9 is a flow chart illustrating an embodiment of a method for rack front-to-rear cable routing.

Referring now to FIG. 9, an embodiment of a method 900 for rack front-to-rear cable routing is illustrated. As discussed below, the systems and methods of the present disclosure provide racks with front-to-rear cable routing devices defining protected cable conduits through which cables may be routed between ports on computing devices that are accessible via a "front" side of the rack, and ports on computing devices that are accessible via a "rear" side of the rack. For example, the rack front-to-rear cable routing system of the present disclosure may include a rack chassis having a first rack wall, a second rack wall opposite the first rack wall, a first rack entrance defined between the first and second rack walls, and a second rack entrance defined between the first and second rack walls and opposite the first rack entrance. A computing device housing is defined by the rack chassis. A rack front-to-rear cable routing device is located between the computing device housing and the first rack wall, and defines a protected cable conduit extending between the first and second rack entrances. The protected cable conduit houses a first cable connected to each of a first port on a first computing device in the computing device housing located adjacent the first rack entrance, and a second port on a second computing device in the computing device housing located adjacent the second rack entrance. As such, cables may be routed from front-to-rear in a rack in a protected manner that eliminate the issues with conventional front-to-rear rack cable routing discussed above.

Figure 10:
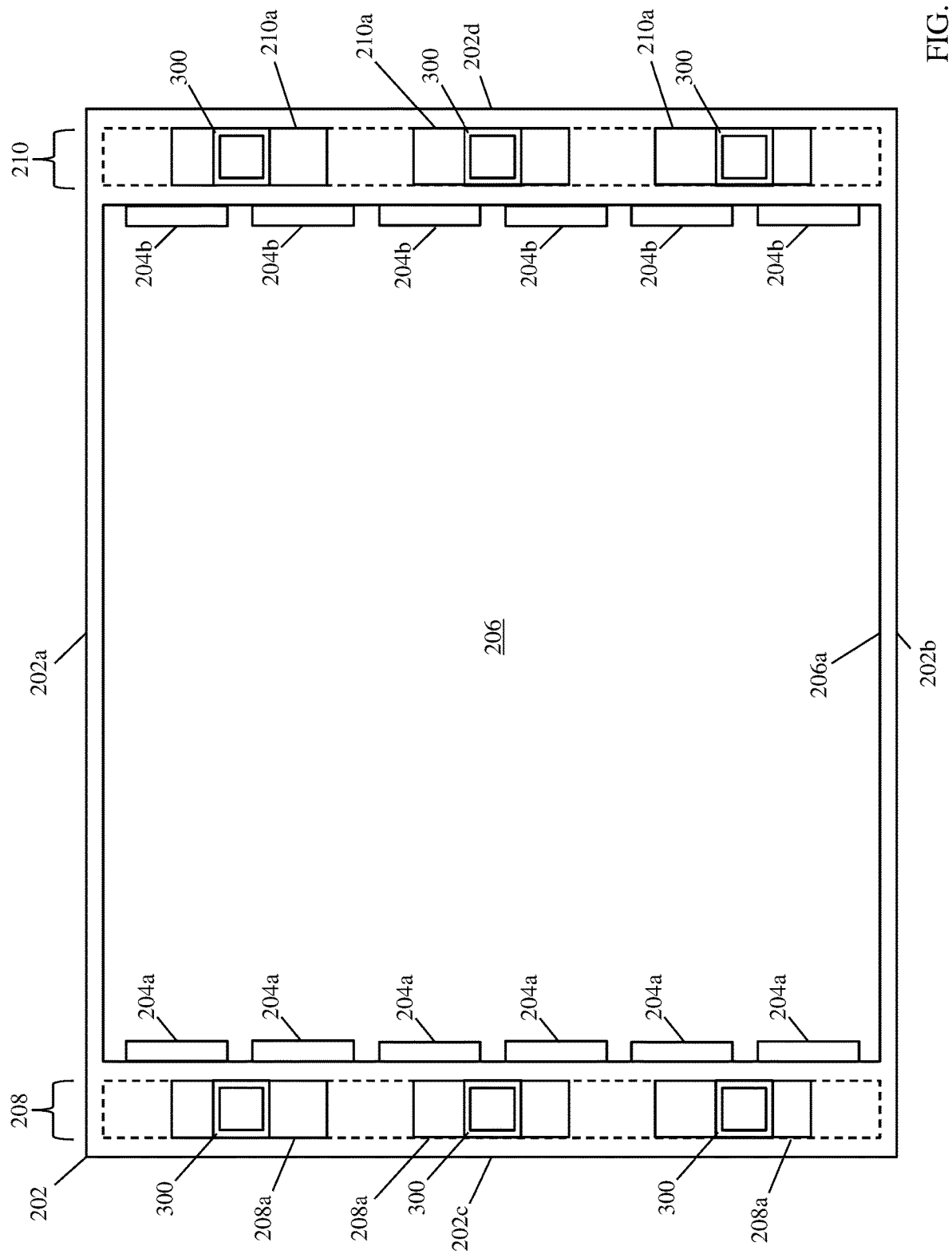
FIG. 10 is a schematic view illustrating an embodiment of the rack front-to-rear cable routing device of FIG. 3A provided in the rack of FIGS. 2A and 2B during the method of FIG. 9.

The method 900 begins at block 902 where rack is provided with one or more front-to-rear cable routing devices. With reference to FIG. 10, in an embodiment of block 902, a plurality of cable routing devices 300 may be provided in the cable routing device housing 208 defined by the rack chassis 202 between the side wall 202c and the computing device mounting subsystems 204a, and a plurality of cable routing devices 300 may be provided in the cable routing device housing 210 defined by the rack chassis 202 between the side wall 202d and the computing device mounting subsystems 204b. However, while the rack 200 is described as being provided at block 902 of the method 900 with the cable mounting devices 300 discussed above with reference to FIG. 3, one of skill in the art in possession of the present disclosure will appreciate how the rack 200 may be provided with any of (and/or any combination of) the rack mounting devices 400 of FIG. 4, the rack mounting devices 500 of FIG. 5, the rack mounting devices 600 of FIG. 6, the rack mounting devices 700 of FIG. 7, the rack mounting devices 800 of FIG. 8, and/or other rack mounting devices provided according to the teachings of the present disclosure based on the requirements of the cable routing, user, and/or benefits provided by the different embodiments of cable routing devices described herein.

As discussed above, in some embodiments, the rack 200 may be manufactured such that the cable routing devices 300 discussed above are integrated in the rack chassis 202. However, in other embodiments, the cable routing devices 300 may be provided in the rack 200 by, for example, a network technician, datacenter administrator, and/or other user of the rack. As such, in different examples any of the cable routing devices 300 may be positioned in the rack chassis 202 without the use of rack mounting features, coupled to the rack chassis 202 with the magnetic rack mounting features 306 (or adhesive rack mounting features) discussed above with reference to FIG. 3B, coupled to the rack chassis 202 with the hook rack mounting features 308 discussed above with reference to FIG. 3C, coupled to the rack chassis 202 with the rack-based bracket rack mounting features 310 discussed above with reference to FIG. 3D, coupled to the rack chassis 202 with the computing-device-mounting-subsystem-based bracket rack mounting feature 312 discussed above with reference to FIG. 3E, and/or coupled to the rack chassis 202 using other rack mounting features that would be apparent to one of skill in the art in possession of the present disclosure. As such, one of skill in the art in possession of the present disclosure will appreciate how the rack chassis 202 may be configured with plurality of different rack locations that are each configured to mount to a cable routing device 300, thus allowing any particular cable routing device 300 to mount multiple different locations on the rack 200.

Figure 11:
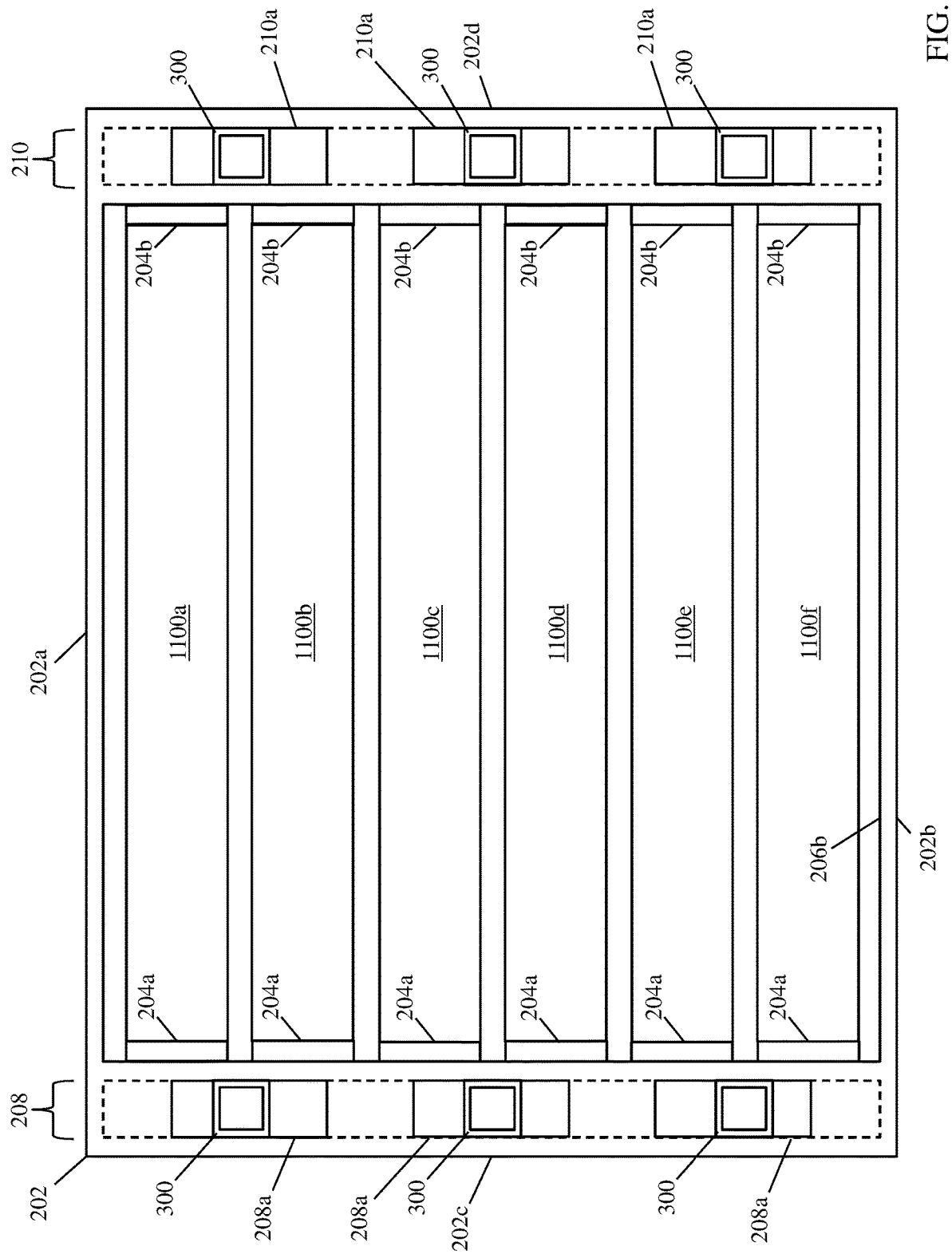
FIG. 11 is a schematic view illustrating an embodiment of computing devices provided in the rack of FIG. 10 during the method of FIG. 9.

The method 900 then proceeds to block 904 where computing devices are provided in the rack. With reference to FIG. 11, in an embodiment of block 904, a plurality of computing devices 1100a, 1100b, 1100c, 1100d, 1100e, and 1100f may be positioned in the computing device housing 206 by coupling each of those computing devices to a respective pair of computing device mounting subsystems 204a/204b using techniques that would be apparent to one of skill in the art in possession of the present disclosure (e.g., by coupling each computing device 1100a-f to a respective pair of the READYRAIL® computing device mounting subsystems 204a/204b described above). For example, the computing device 1100a may be provided by a switch device that, as discussed above, includes ports or other connectors on its "front" surface that are located adjacent the "front" rack entrance 206a of the rack 200 when that switch device is positioned in the rack chassis 202, while the computing devices 1100b-1100f may be provided by server devices and/or storage systems that, as discussed above, include ports or other connectors on their "rear" surface that are located adjacent the "rear" rack entrance 206b of the rack 200 when those server devices and storage systems are positioned in the rack chassis 202.

Figure 12A:
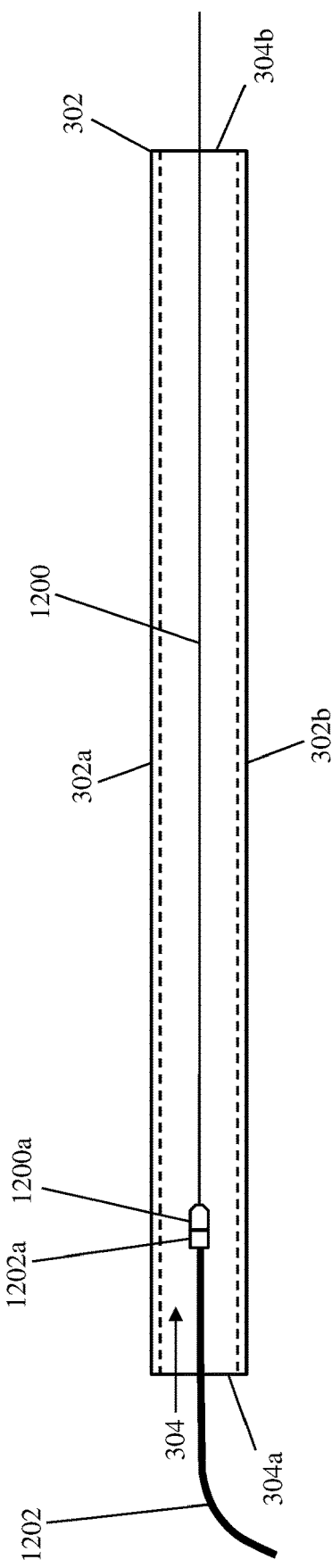
FIG. 12A is a schematic view illustrating an embodiment of a cable being positioned in the rack front-to-rear cable routing device in the rack of FIG. 10 during the method of FIG. 9.
Figure 12B:
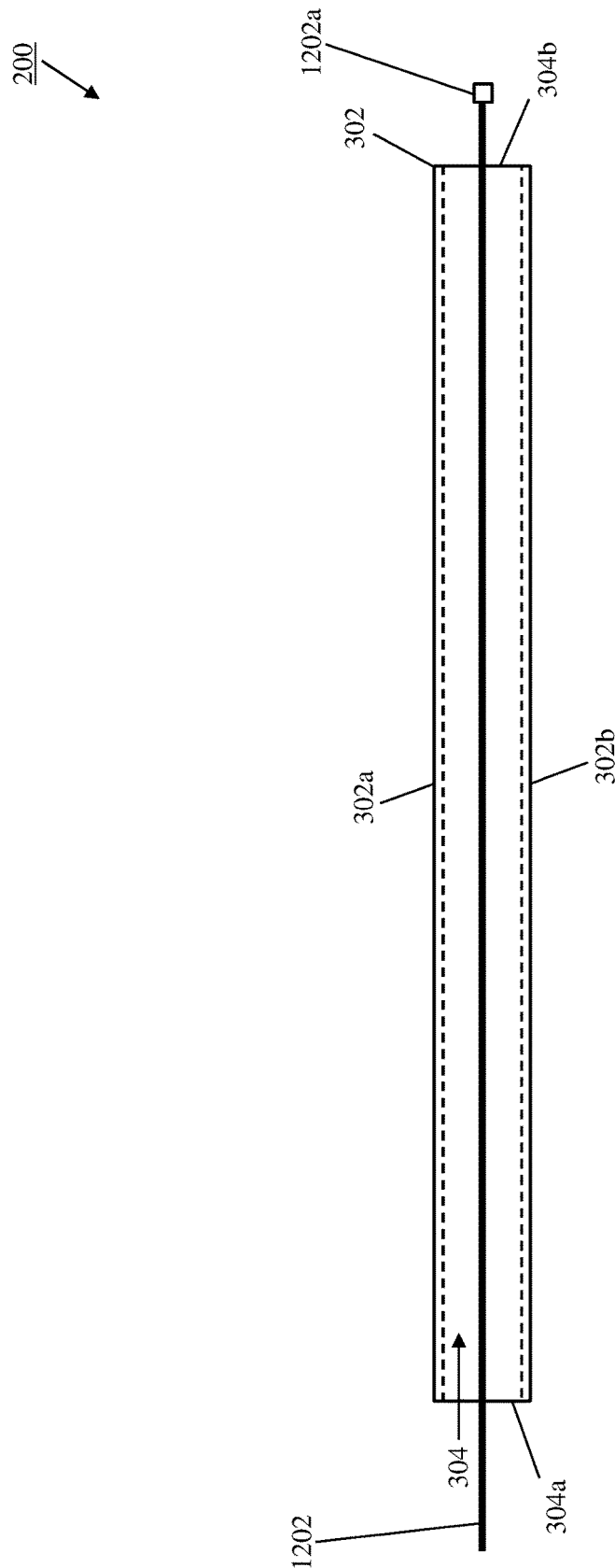
FIG. 12B is a schematic view illustrating an embodiment of a cable being positioned in the rack front-to-rear cable routing device in the rack of FIG. 10 during the method of FIG. 9.

The method 900 then proceeds to block 906 where one or more cables are routed between computing devices in the rack via protected cable conduit(s) defined by the rack front-to-rear cable routing device(s). With reference to FIGS. 12A and 12B, in an embodiment of block 906, a cable "pulling" device 1200 may be provided that includes a cable coupling connector 1200a on one end. Furthermore, in this example, a cable 1200 including a connector 1202a may extend from a computing device 1100a-1100f in the rack 200 (e.g., as an integrated cable on that computing device, or following its connection to a port on that computing device via a connector that is opposite the cable 1202 from the connector 1202a), and a network technician, datacenter administrator, or other user may couple the cable coupling connector 1200a on the cable pulling device 1200 to the connector 1202a on the cable 1202. The network technician, datacenter administrator, or other user may then move the portion of the cable pulling device 1200 opposite its cable coupling connector 1200a through the protected cable conduit entrance 304a of the protected cable conduit 304 on the cable routing device 300 until that portion of the cable pulling device 1200 moves through the protected cable conduit exit 304b on the protected cable conduit 304, as illustrated in FIG. 12A. As such, the end of the cable pulling device 1200 opposite the cable coupling connector 1200a may be rounded or otherwise configured to move past other cables that may be located in the protected cable conduit 304 without "catching" or otherwise damaging those cables.

The network technician, datacenter administrator, or other user may then grasp the cable pulling device 1200 and continue to move it through the protected cable conduit exit 304*b* on the protected cable conduit 304 until the connector 1202*a* on the cable 1202 moves out of the protected cable conduit exit 304*b* on the protected cable conduit 304 as illustrated in FIG. 12B, which allows that cable 1200 to be connected to another computing device 1100*a*-1100*f* in the rack 200. However, while a specific technique for providing a cable in the protected cable conduit defined by the cable routing devices of the present disclosure has been described, one of skill in the art in possession of the present disclosure will appreciate how cables may be provided in the protected cable conduit defined by the cable routing devices of the present disclosure using other techniques that will fall within the scope of the present disclosure as well.

Figure 13A:
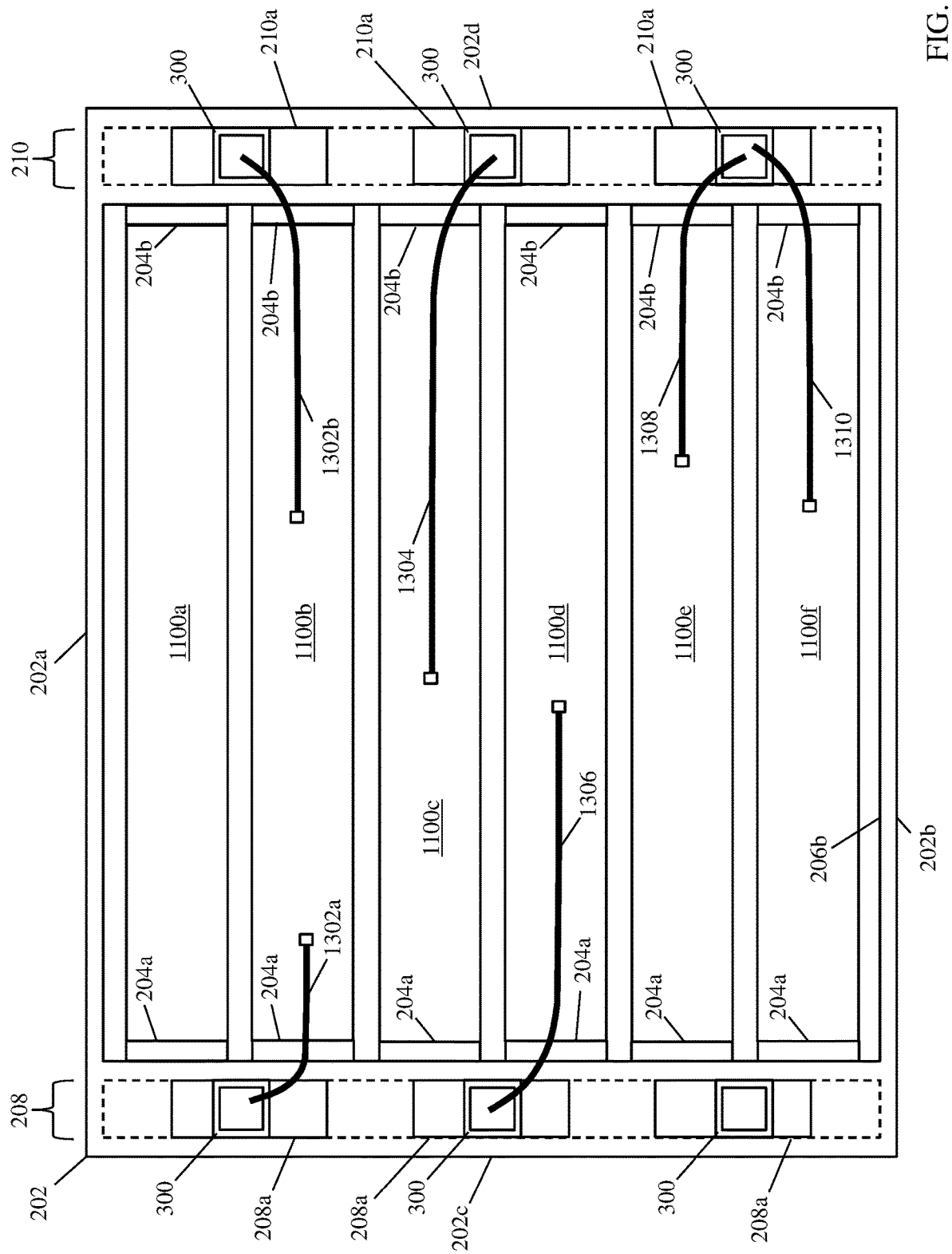
FIG. 13A is a schematic view illustrating an embodiment of cables routed between the computing devices and through the rack front-to-rear cable routing device in the rack of FIG. 10 during the method of FIG. 9.
Figure 13B:
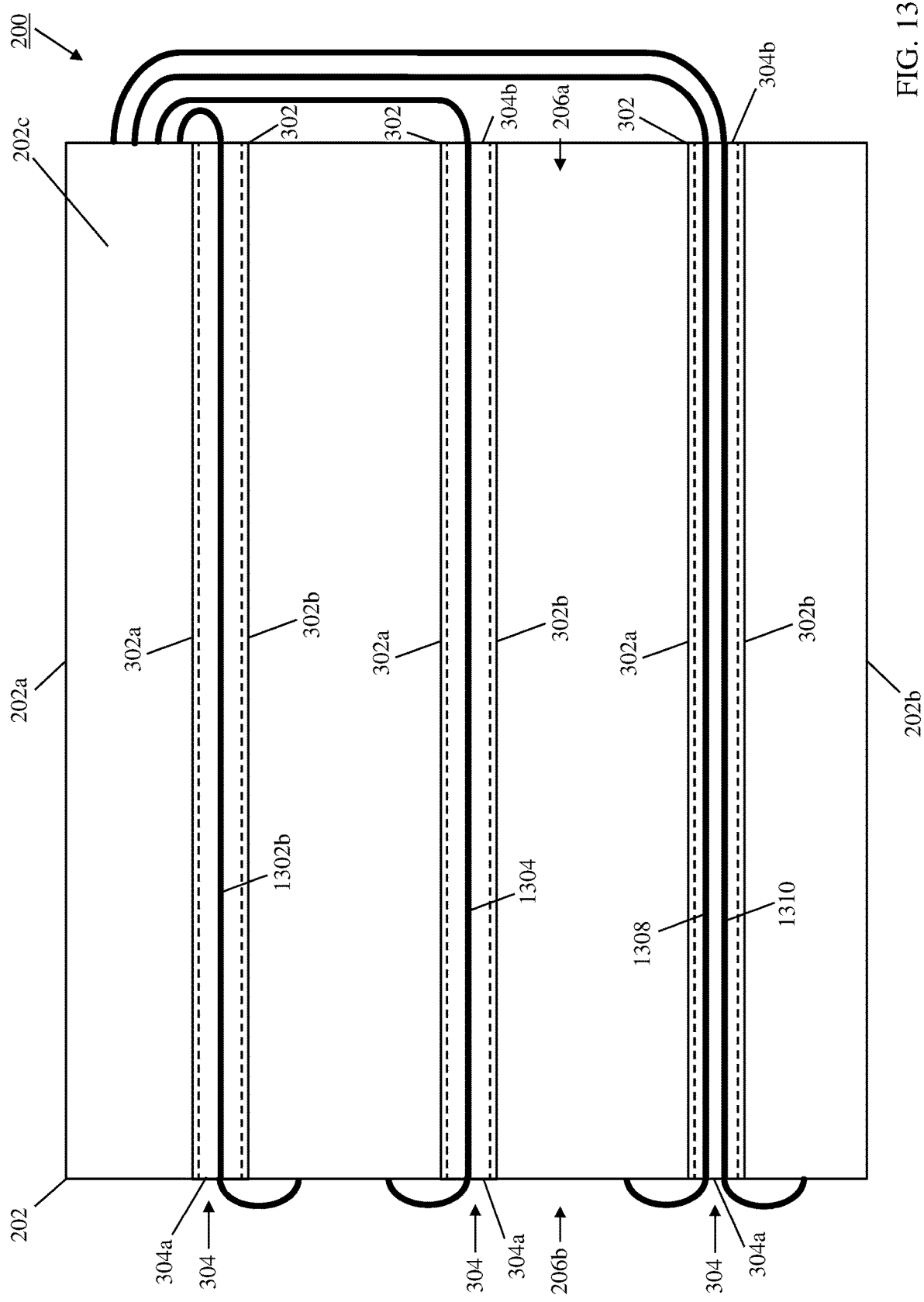
FIG. 13B is a schematic view illustrating an embodiment of cables routed between the computing devices and through the rack front-to-rear cable routing device in the rack of FIG. 10 during the method of FIG. 9.

As such, with reference to FIGS. 13A and 13B, the computing devices 1100*a*-1100*f* may be cabled together by routing cables "front-to-rear" on the rack 200 between ports on computing device adjacent the "front" rack entrance 206*a* and ports on computing devices adjacent the "rear" rack entrance 206*b* via the cable routing devices. For example, FIG. 13A illustrates how a pair of cables 1302*a* and 1302*b* that extend from the computing device 1100*b* are routed from the "rear" rack entrance 206*b* of the rack 200 and via respective cable routing devices 300 to the "front" rack entrance 206*a*, a cable 1304 that extends from the computing device 1100*c* is routed from the "rear" rack entrance 206*b* of the rack 200 and via a cable routing device 300 to the "front" rack entrance 206*a*, a cable 1306 that extends from the computing device 1100*d* is routed from the "rear" rack entrance 206*b* of the rack 200 and via a cable routing device 300 to the "front" rack entrance 206*a*, a cable 1308 that extends from the computing device 1100*e* is routed from the "rear" rack entrance 206*b* of the rack 200 and via a cable routing device 300 to the "front" rack entrance 206*a*, and a cable 1310 that extends from the computing device 1100*f* is routed from the "rear" rack entrance 206*b* of the rack 200 and via a cable routing device 300 to the "front" rack entrance 206*a*.

Furthermore, FIG. 13B illustrates how the cable 1302*b* routed via the cable routing device 300 to the "front" rack entrance 206*a* may be connected to the computing device 1100*a*, the cable 1304 routed via the cable routing device 300 to the "front" rack entrance 206*a* may be connected to the computing device 1100*a*, and the cables 1308 and 1310 routed via the cable routing device 300 to the "front" rack entrance 206*a* may be connected to the computing device 1100*a*. However, while one of skill in the art in possession of the present disclosure will recognize that FIGS. 13A and 13B illustrate an example of server devices and/or storage systems connected to a switch device, one of skill in the art in possession of the present disclosure will appreciate how other device may be connected in other configurations via the cable routing devices of the present disclosure while remaining within the scope of the present disclosure as well.

As will be appreciated by one of skill in the art in possession of the present disclosure, once the computing devices 1100*a*-1100*f* have been cabled together as described above, the protected cable conduit identifiers like those described above with reference to the cable routing devices 400, 500, and 800 in FIGS. 4, 5, and 8, respectively, may be used to allow any cable that connects computing devices in the front-to-rear manner described above to be identified both at the "front" rack entrance 206*a* and the "rear" rack entrance 206*b* of the rack chassis 202 by, for example, identifying the protected cable conduit identifier for a protected cable conduit that houses a cable at the "rear" rack entrance 206*b* of the rack chassis 202, and then finding that protected cable conduit identifier for that protected cable conduit that houses that cable at the "front" rack entrance 206*b* of the rack chassis 202, which one of skill in the art in possession of the present disclosure will appreciate assures a network technician, datacenter administrator, or other user that the cable included in that protected cable conduit is the cable of interest.

Thus, systems and methods have been described that provide racks with front-to-rear cable routing devices defining protected cable conduits through which cables may be routed between ports on computing devices that are accessible via a "front" side of the rack, and ports on computing devices that are accessible via a "rear" side of the rack. For example, the rack front-to-rear cable routing system of the present disclosure may include a rack chassis having a first rack wall, a second rack wall opposite the first rack wall, a first rack entrance defined between the first and second rack walls, and a second rack entrance defined between the first and second rack walls and opposite the first rack entrance. A computing device housing is defined by the rack chassis. A rack front-to-rear cable routing device is located between the computing device housing and the first rack wall, and defines a protected cable conduit extending between the first and second rack entrances. The protected cable conduit houses a first cable connected to each of a first port on a first computing device in the computing device housing located adjacent the first rack entrance, and a second port on a second computing device in the computing device housing located adjacent the second rack entrance. As such, cables may be routed from front-to-rear in a rack in a protected manner that eliminate the issues with conventional front-to-rear rack cable routing discussed above.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A rack front-to-rear cable routing system, comprising:
   a rack chassis including a first rack wall, a second rack wall located opposite the rack chassis from the first rack wall, a third rack wall located between the first rack wall and the second rack wall, a first rack entrance defined between the first rack wall and the second rack wall, and a second rack entrance defined between the first rack wall and the second rack wall and opposite the rack chassis from the first rack entrance;
   a computing device housing that is defined by the rack chassis between the first rack wall and the third rack wall;
   a rack front-to-rear cable routing device that is located at a first location on the rack chassis between the second rack wall and the third rack wall, that extends between the first rack entrance and the second rack entrance, and that defines a first protected cable conduit along a length of the rack front-to-rear cable routing device between the first rack entrance and the second rack entrance that is configured to house and protect a first cable that is connected to each of a first port that is located adjacent the first rack entrance and that is included on a first computing device in the computing device housing that is separate from the rack front-torear cable routing device, and a second port that is located adjacent the second rack entrance and that is included on a second computing device in the computing device housing that is separate from the rack front-to-rear cable routing device; and a rack chassis coupling feature that is included on the rack front-to-rear cable routing device, that couples the rack front-to-rear cable routing device to the rack chassis at the first location, and that configured to couple the first rack front-to-rear cable routing device to a plurality of second locations on the rack chassis that are different than the first location.

2. The system of claim 1, wherein the first protected cable conduit is defined on all sides by a rack front-to-rear cable routing chassis of the rack front-to-rear cable routing device that extends along the length of the rack front-to-rear cable routing device between the first rack entrance and the second rack entrance.

3. The system of claim 1, wherein the rack chassis includes a fourth rack wall that is located opposite the first rack wall from the computing device housing, and wherein at least one of the plurality of second locations on the rack chassis is provided between the first rack wall and the fourth rack wall.

4. The system of claim 1, wherein the first protected cable conduit is configured to house a second cable that is connected to a third port that is located adjacent the first rack entrance and that is included on a third computing device in the computing device housing that is separate from the rack front-to-rear cable routing device, and a fourth port on the second computing device.

5. The system of claim 1, wherein the rack front-to-rear cable routing device defines at least one second protected cable conduit along the length of the rack front-to-rear cable routing device between the first rack entrance and the second rack entrance, and wherein each second protected cable conduit is configured to house a respective second cable that extends between the first rack entrance and the second rack entrance.

6. The system of claim 5, wherein the rack front-to-rear cable routing device includes a respective cable conduit identifier located adjacent an entrance of the first protected cable conduit and each at least one second protected cable conduit.

7. An Information Handling System (IHS), comprising:
a rack chassis including a first rack wall, a second rack wall located opposite the rack chassis from the first rack wall, a third rack wall located between the first rack wall and the second rack wall, a first rack entrance defined between the first rack wall and the second rack wall, and a second rack entrance defined between the first rack wall and the second rack wall and opposite the rack chassis from the first rack entrance;
a plurality of computing devices that are housed in the rack chassis between the first rack wall and the third rack wall and that include a first computing device and a second computing device;
a first rack front-to-rear cable routing device that is separate from each of the plurality of computing devices, that is located at a first location on the rack chassis between the second rack wall and the third rack wall, that extends between the first rack entrance and the second rack entrance, and that defines a first protected cable conduit along a length of the first rack front-to-rear cable routing device between the first rack entrance and the second rack entrance that is configured to house and protect a first cable that extends from a first surface of the first computing device that is adjacent the first rack entrance, and to a second surface of the second computing device that is adjacent the second rack entrance; and a rack chassis coupling feature that is included on the first rack front-to-rear cable routing device, that couples the first rack front-to-rear cable routing device to the rack chassis at the first location, and that configured to couple the first rack front-to-rear cable routing device to a plurality of second locations on the rack chassis that are different than the first location.

8. The IHS of claim 7, wherein the first protected cable conduit is defined on all sides by a rack front-to-rear cable routing chassis of the first rack front-to-rear cable routing device that extends along the length of the first rack front-to-rear cable routing device between the first rack entrance and the second rack entrance.

9. The IHS of claim 7, wherein the rack chassis includes a fourth rack wall that is located opposite the first rack wall from the third rack wall, and wherein at least one of the plurality of second locations on the rack chassis is provided between the first rack wall and the fourth rack wall.

10. The IHS of claim 7, wherein the first protected cable conduit is configured to house a second cable that extends from a third surface of a third computing device that is included in the plurality of computing devices and that is adjacent the first rack entrance, and the second surface of the second computing device.

11. The IHS of claim 7, wherein the first rack front-to-rear cable routing device defines at least one second protected cable conduit along the length of the first rack front-to-rear cable routing device between the first rack entrance and the second rack entrance, and wherein each second protected cable conduit is configured to house a respective second cable that extends between the first rack entrance and the second rack entrance.

12. The IHS of claim 11, wherein the first rack front-to-rear cable routing device includes a respective cable conduit identifier located adjacent an entrance of the first protected cable conduit and each at least one second protected cable conduit.

13. The IHS of claim 7, further comprising:
a third computing device included in the plurality of computing devices;
a fourth computing device included in the plurality of computing devices; and
a second rack front-to-rear cable routing device that is separate from each of the plurality of computing devices, that is located at one of the plurality of second locations on the rack chassis between the second rack wall and the third rack wall, that extends between the first rack entrance and the second rack entrance, and that defines a second protected cable conduit along a length of the second rack front-to-rear cable routing device between the first rack entrance and the second rack entrance that is configured to house and protect a second cable that extends from a first surface of the third computing device that is adjacent the first rack entrance, and to a second surface of the fourth computing device that is adjacent the second rack entrance.

14. A method for rack front-to-rear cable routing, comprising:
providing a rack chassis including a first rack wall, a second rack wall located opposite the rack chassis from the first rack wall, a third rack wall located between the first rack wall and the second rack wall, a first rack entrance defined between the first rack wall and the second rack wall, and a second rack entrance defined between the first rack wall and the second rack wall and opposite the rack chassis from the first rack entrance;

positioning, in the rack chassis between the first rack wall and the third rack wall, a plurality of computing devices that include a first computing device and a second computing device; and routing, by a first rack front-to-rear cable routing device that is separate from each of the plurality of computing devices and that is coupled to a first location on the rack chassis between the second rack wall and the third rack wall using a rack chassis coupling feature that is included on the first rack front-to-rear cable routing device, a first cable via a first protected cable conduit defined by the first rack front-to-rear cable routing device along a length of the first rack front-to-rear cable routing device between the first rack entrance and the second rack entrance from a first surface of the first computing device that is adjacent the first rack entrance to a second surface of the second computing device that is adjacent the second rack entrance, wherein the rack chassis coupling feature included on the first rack front-to-rear cable routing device is configured to couple the first rack front-to-rear cable routing device to a plurality of second locations on the rack chassis that are different than the first location.

15. The method of claim 14, wherein the first protected cable conduit is defined on all sides by a rack front-to-rear cable routing chassis of the first rack front-to-rear cable routing device that extends along the length of the first rack front-to-rear cable routing device between the first rack entrance and the second rack entrance.

16. The method of claim 14,
wherein the rack chassis includes a fourth rack wall that is located opposite the first rack wall from the third rack wall, and wherein at least one of the plurality of second locations on the rack chassis is provided between the first rack wall and the fourth rack wall.

17. The method of claim 14, further comprising:
routing, via the first protected cable conduit, a second cable from a third surface of a third computing device that is included in the plurality of computing devices and that is adjacent the first rack entrance to the second surface of the second computing device.

18. The method of claim 14, further comprising:
routing, by the first rack front-to-rear cable routing device via each at least one second protected cable conduit defined by the first rack front-to-rear cable routing device along the length of the first rack front-to-rear cable routing device between the first rack entrance and the second rack entrance, a respective second cable that extends between the first rack entrance and the second rack entrance.

19. The method of claim 18, wherein the first rack front-to-rear cable routing device includes a respective cable conduit identifier located adjacent an entrance of the first protected cable conduit and each at least one second protected cable conduit.

20. The method of claim 14, wherein the plurality of computing devices include a third computing device and a fourth computing device, and wherein the method further comprises:
routing, by a second rack front-to-rear cable routing device that is separate from each of the plurality of computing devices and that is coupled to one of the plurality of second locations on the rack chassis between the second rack wall and the third rack wall using a rack chassis coupling feature that is included on the second rack front-to-rear cable routing device, a second cable via a second protected cable conduit defined by the second rack front-to-rear cable routing device along a length of the second rack front-to-rear cable routing device between the first rack entrance and the second rack entrance from a first surface of the third computing device that is adjacent the first rack entrance to a second surface of the fourth computing device that is adjacent the second rack entrance.

* * * * *